US006952869B2

(12) United States Patent
Suhara et al.

(10) Patent No.: US 6,952,869 B2
(45) Date of Patent: Oct. 11, 2005

(54) ELECTRIC-COMPONENT MOUNTING SYSTEM FOR MOUNTING ELECTRIC COMPONENT ON A CIRCUIT SUBSTRATE

(75) Inventors: Shinsuke Suhara, Kariya (JP); Toshiya Ito, Nishio (JP); Hirokazu Koike, Chiryu (JP)

(73) Assignee: Fuji Machine Mfg. Ltd., Chiryu (JP)

( * ) Notice: Subject to any disclaimer, the term of this patent is extended or adjusted under 35 U.S.C. 154(b) by 657 days.

(21) Appl. No.: 10/025,802

(22) Filed: Dec. 26, 2001

(65) Prior Publication Data

US 2002/0083579 A1 Jul. 4, 2002

(30) Foreign Application Priority Data

Dec. 28, 2000 (JP) ....................................... 2000-402272

(51) Int. Cl.[7] ................................................ B23P 19/00

(52) U.S. Cl. ............................ 29/740; 29/739; 29/720; 29/832; 29/833

(58) Field of Search .......................... 29/832, 739, 740, 29/822, 720

(56) References Cited

U.S. PATENT DOCUMENTS

| | | | | |
|---|---|---|---|---|
| 6,006,425 A | | 12/1999 | Fukukura et al. | |
| 6,088,913 A | * | 7/2000 | Sakaguchi | 29/832 |
| 6,739,036 B2 | * | 5/2004 | Koike et al. | 29/743 |

FOREIGN PATENT DOCUMENTS

| | | | |
|---|---|---|---|
| EP | 0 312 116 A2 | | 4/1989 |
| JP | 4-344411 A | | 12/1992 |
| JP | 6-342998 A | | 12/1994 |
| JP | 7-63106 B2 | | 7/1995 |
| JP | 2574218 B2 | | 10/1996 |
| JP | 2578761 B2 | | 11/1996 |
| JP | 2589063 B2 | | 12/1996 |
| JP | 3167896 | * | 3/2005 |

OTHER PUBLICATIONS

U.S. Appl. No. 09/693,956, filed Oct. 23, 2000, Isogai et al.
U.S. Appl. No. 09/721,953, filed Nov. 27, 2000, Kawada et al.

* cited by examiner

*Primary Examiner*—Rick Kiltae Chang
(74) *Attorney, Agent, or Firm*—Oliff & Berridge, PLC

(57) ABSTRACT

An electric-component mounting system including a component-holding device for holding an electric component, a board-supporting device for supporting a printed-wiring board on which the electric component is mounted, a first relative-movement device operable to move the component-holding device and the board-supporting device relative to each other in a first direction parallel to a surface of the board supported by the board-supporting device, a second relative-movement device operable to move the component-holding device and the board-supporting device relative to each other in a second direction which intersects the surface of the board; and a control device including a positioning portion operable to select one of a plurality of different control targets which is used for the first relative-movement device to establish a predetermined relative position between the component-holding device and the board-supporting device, and wherein the positioning portion selects one of the different control targets, depending upon a pattern of control of an operating speed of the first relative-movement device.

15 Claims, 16 Drawing Sheets

FIG. 13

| COMPONENT-HOLDING HEAD 140 | SUCTION NOZZLE 210 | POSITIONING ERROR DETECTED AT 100% SPEED OF CAM 112 | POSITIONING ERROR DETECTED AT 80% SPEED OF CAM 112 |
|---|---|---|---|
| 1 | A | ΔXCA1, ΔYCA1 | ΔXCA'1, ΔYCA'1 |
| | B | ΔXCB1, ΔYCB1 | ΔXCB'1, ΔYCB'1 |
| | C | ΔXCC1, ΔYCC1 | ΔXCC'1, ΔYCC'1 |
| | D | ΔXCD1, ΔYCD1 | ΔXCD'1, ΔYCD'1 |
| | E | ΔXCE1, ΔYCE1 | ΔXCE'1, ΔYCE'1 |
| | F | ΔXCF1, ΔYCF1 | ΔXCF'1, ΔYCF'1 |
| 2 | A | ΔXCA2, ΔYCA2 | ΔXCA'2, ΔYCA'2 |
| | B | ΔXCB2, ΔYCB2 | ΔXCB'2, ΔYCB'2 |

FIG. 14

| SPEED OF CAM 112 DURING STOPPING OF HEAD 140 \ SPEED OF CAM 112 DURING MOVEMENT OF HEAD 140 | 100% | 80% | 60% |
|---|---|---|---|
| 100% | POSITIONING ERROR DETECTED AT 100% SPEED OF CAM 112 | POSITIONING ERROR DETECTED AT 80% SPEED OF CAM 112 | POSITIONING ERROR DETECTED AT 80% SPEED OF CAM 112 |
| 80% | POSITIONING ERROR DETECTED AT 80% SPEED OF CAM 112 | POSITIONING ERROR DETECTED AT 80% SPEED OF CAM 112 | POSITIONING ERROR DETECTED AT 80% SPEED OF CAM 112 |
| 60% | POSITIONING ERROR DETECTED AT 80% SPEED OF CAM 112 | POSITIONING ERROR DETECTED AT 80% SPEED OF CAM 112 | POSITIONING ERROR DETECTED AT 80% SPEED OF CAM 112 |

ELECTRIC-COMPONENT MOUNTING SYSTEM FOR MOUNTING ELECTRIC COMPONENT ON A CIRCUIT SUBSTRATE

This application is based on Japanese Patent Application No. 2000-402272 filed on Dec. 28, 2000, the contents of which are incorporated hereinto by reference.

BACKGROUND OF THE INVENTION

1. Field of the Invention

The present invention relates in general to electric-component mounting system and method for mounting electric components (typically, electronic components) on a circuit substrate, and more particularly to techniques for improving the efficiency of mounting of the electric components.

2. Discussion of Related Art

JP-A-342998 discloses an example of an electric-component mounting system including a plurality of component-holding heads which are arranged around a common axis of turning and turned about this common axis, to mount electric components on a printed-wiring board. The component-holding heads are disposed on an indexing body rotatable about a vertical axis, such that the component-holding heads are equiangularly spaced apart from each other along a circle having a center on the vertical axis of rotation of the indexing body. With a rotary intermittent motion of the indexing body, the component-holding heads are turned about the vertical axis of rotation of the indexing body (which is the above-indicated common axis of turning of the heads). The indexing body has a plurality of working positions or stations at which the component-holding heads are temporarily stopped. These working positions includes a component-receiving position and a component-mounting position. At the component-receiving position, the component-holding head receives an electric component from a component supply device. At the component-mounting position, the electric component is transferred from the component-holding head onto the printed-wiring board.

In this electric-component mounting system, a printed-wiring-board supporting and positioning device is provided to support the printed-wiring board and move the board in a horizontal plane parallel to the component-mounting surface of the printed-wiring board. The printed-wiring board is positioned such that a selected spot on the component-mounting surface of the board is located right below the component-holding head stopped at the component-mounting position, so that the electric component is mounted at the selected spot. The printed-wiring board is moved during rotation of the indexing body, and is stopped when the electric component is mounted on the board. Thus, an operation to mount the electric component on the board is performed while the component-holding head and the printed-wiring board are both stopped. However, the electric-component mounting system may suffer from a deviation of the position of the electric component actually mounted on the board, with respect to a nominal position on the board. This deviation of the actual mounting position of the component from the nominal position may be caused by an error of relative positioning between the component-holding head and the printed-wiring board, a positioning error of the electric component as held by the component-holding head, and a positioning error of the board by the printed-wiring-board supporting and positioning device.

The different component-holding heads have respective different positioning errors relative to the printed-wiringboard supporting and positioning device, and each component-holding head has substantially the same positioning error relative to the printed-wiring-board supporting and positioning device, for all of different kinds of electric components and for all of different mounting positions on the board. In view of these facts, it is a conventional practice to obtain the amount and direction of positioning error of each of the plurality of component-holding heads, and board-positioning data to position the printed-wiring board upon mounting of the electric components on the board are compensated on the basis of the obtained amount and direction of the positioning error, so that the electric components are mounted at the respective nominal positions. Thus, the position of the board upon mounting of each electric component is adjusted to reduce or eliminate the positioning error of each component with respect to the nominal mounting position.

The present inventors attempted to increase the acceleration and deceleration of the component-holding heads during movements of the heads, in an effort to reduce the required time of the movements for thereby improving the efficiency of mounting of the electric components. However, the increased acceleration and deceleration of the component-holding heads resulted in a considerable amount of deviation of the actual mounting positions of the electric components with respect to the nominal mounting positions, in spite of the compensation of the board-positioning data on the basis of the obtained amount and direction of the positioning error of each component-holding head. It was found that the amount and direction of the positioning error of a given component-holding head which is obtained during a movement of the head at a speed controlled in a certain pattern do not permit elimination or sufficient reduction of the positioning error of the same component-holding head when the head is moved at a speed controlled in another pattern. In this case, the mounting accuracy of the electric component is deteriorated. Thus, there is a limitation in the degree of improvement of the component mounting efficiency by reducing the required time of movement of the component-holding head, while assuring a sufficiently high degree of component mounting accuracy. This limitation appears to arise from an increased amount of vibration of the component-holding head caused by the increased acceleration and deceleration of the head, due to insufficient rigidity of the component-holding head and a device including the indexing body for turning the component-holding head. Namely, the electric component appears to be mounted on the printed-wiring board before the vibration has been sufficiently attenuated after the head is stopped. Although it is considered to improve the component mounting accuracy by increasing the rigidity of the component-holding head and the turning device, an increase in the rigidity necessarily causes an increase in the masses of the head and the turning device, which in turn causes problems such as deterioration of the component mounting accuracy, and an increase in the cost of manufacture of the electric-component mounting system.

SUMMARY OF THE INVENTION

It is therefore an object of the present invention to provide improve the efficiency of mounting of electric components by reducing the required time of movement of the component-holding head, without causing deterioration of the component mounting accuracy and an increase in the cost of manufacture of the mounting system. This object may be achieved according to any one of the following modes of the present invention in the form of an electric-component mounting system or method, each of which is numbered like the appended claims and depends from the other mode or modes, where appropriate, to indicate and clarify possible combinations of elements or technical features. It is to be understood that the present invention is not limited to the technical features or any combinations thereof which will be described for illustrative purpose only. It is to be further understood that a plurality of elements or features included in any one of the following modes of the invention are not necessarily provided all together, and that the invention may be embodied without some of the elements or features described with respect to the same mode.

(1) An electric-component mounting system characterized by comprising:

a component-holding device arranged to hold an electric component;

a board-supporting device arranged to support a printed-wiring board on which the electric component is mounted;

a first relative-movement device operable to move the component-holding device and the board-supporting device relative to each other in a first direction parallel to a surface of the printed-wiring board supported by the board-supporting device;

a second relative-movement device operable to move the component-holding device and the board-supporting device relative to each other in a second direction which intersects the surface of the printed-wiring board supported by the board-supporting device; and a control device including a positioning portion operable to select one of a plurality of different control targets which is used for the first relative-movement device to establish a predetermined relative position between the component-holding device and the board-supporting device, the positioning portion selecting the above-indicated one of the plurality of different control targets, depending upon a pattern of control of an operating speed of the first relative-movement device.

The pattern of control of the operating speed of the first relative-movement device may be changed in steps, or continuously or in an infinite number of steps. Where the control target is changed continuously, it is considered that there are an infinite number of different control targets.

The first relative-movement device may be arranged to move the component-holding device relative to the board-supporting device, in a plane parallel to the surface of the printed-wiring board, along two mutually perpendicular axes. Alternatively, the first relative-movement device may be arranged to move the component-holding device and the board supporting device along one and the other of the mutually perpendicular two axes in the above-indicated plane. Further alternatively, the first relative-movement device may be arranged to move the board-supporting device along the above-indicated two axes, and turn the component-holding device about an axis perpendicular to the above-indicated plane. Where the component-holding device is moved along the above-indicated two axes, this device may be given another movement. For instance, the first relative-movement device may include an indexing body which carries the component-holding device and which is intermittently rotated about its axis, as described below with respect to the following mode (5) of this invention. In this case the indexing body may be arranged to be moved along the mutually perpendicular two axes in the above-indicated plane, so that the component-holding device is moved to a component-mounting position by an intermittent rotary movement of the indexing body as well as a translating movement of the indexing body in the above-indicted plane. In this instance, the axis of rotation of the indexing body may be perpendicular to the above-indicated plane or inclined with respect to this plane. In either case, the component-holding device is moved to a desired position in the above-indicated plane, by the intermittent rotary movement and translating movement of the indexing body, and the first relative-movement device includes an intermittent rotary drive device operable to intermittently rotate the indexing body, and a moving device operable to translate the indexing body. Where the indexing body is intermittently rotated but is not translated, the first relative-movement device includes the indexing body and a board-positioning device operable to move the printed-wiring board.

The second relative-movement device may be arranged to move both of the component-holding device and the board-supporting device, or only one of these two devices.

The printed-wiring board may be a circuit substrate which has a printed circuit and on which the electric components will be mounted. However, the principle of this invention is applicable to a printed-wiring board on which the electric components are provisionally fixed by an adhesive agent or solder paste, and a printed-wiring board having printed circuit electrically connected to some of the electric components mounted thereon.

In the present electric-component mounting system, the electric component is mounted on the printed-wiring board by relative movements between the component-holding device and the board-supporting device by the first and second relative-movement devices. Usually, the time required for the first relative-movement device to move the component-holding device and the board-supporting device relative to each other is changed depending upon the kind of the electric component to be mounted on the printed-wiring board. On the other hand, the control target used to establish the predetermined relative position between the component-holding device and the board-supporting device is changed depending upon the pattern of control of the operating speed of the first relative-movement device, so that the electric component can be mounted on the printed-wiring board, with a reduced amount of positioning error or without a positioning error, irrespective of a change of the pattern of control of the operating speed of the first relative-movement device. Where the pattern of control of the operating speed is determined so as to reduce the required time of the relative movement of the component-holding device and the board-supporting device, selection of the control target that suits the specific pattern of control makes it possible to establish the predetermined relative position between the two devices, with a reduced amount of positioning error or without a positioning error. Thus, the selection of the control target by the positioning portion of the control device makes it possible to improve the efficiency of mounting of the electric component on the printed-wiring board, by reducing the required time of the relative movement, while preventing deterioration of the positioning accuracy of the electric component. Accordingly, the present electric-component mounting system is capable of mounting the electric component with improved efficiency, without having to increase the rigidity of the component-holding device and/or the board-supporting device which is/are moved by the first relative-movement device, and the rigidity of the first relative-movement device per se, and therefore without increasing the cost of manufacture of the system.

(2) An electric-component mounting system according to the above mode (1), wherein the first relative-movement device includes an XY robot operable to move the component-holding device in an XY plane defined by mutually perpendicular X and Y axes and parallel to the surface of the printed-wiring board supported by the board-supporting device.

In the electric-component mounting system according to the above mode (2), the component-holding device is moved by the XY robot to a predetermined component-mounting position on the printed-wiring board. In this case, the direction of the movement of the component-holding device to the component-mounting position and the pattern of control of the moving speed of the component-holding device change depending upon the component-mounting position and are not constant for all of the electric components. Accordingly, the control target used to position the component-holding device is required to be determined depending upon the component-mounting position. Thus, the principle of this invention is applicable to the present mounting system wherein the component-holding head is moved to each component-mounting position. However, the application of the principle to this type of system requires a relatively complicated control. Where the component-holding device uses a suction nozzle arranged to hold the electric component by suction under a negative pressure, for example, the acceleration and deceleration values of the suction nozzle during its movement to the component-mounting position are desirably changed or controlled depending upon the mass and/or the height dimension of the electric component, in order to prevent dislocation of the electric component with respect to the suction nozzle, or falling of the electric component from the suction nozzle, which dislocation or falling may take place due to an inertia. In this case, the pattern of control of the moving speed of the component-holding device is changed or controlled by controlling the pattern of control of the operating speed of the XY robot. A change of the pattern of control of the moving speed of the component-holding device during its movement to a predetermined component-mounting position causes a change of the actual mounting position of the electric component, since the change of the pattern of control causes a change in the degree of elastic deformation of the component-holding device and a supporting device supporting the component-holding device, which occurs upon stopping of the component-holding device at the predetermined component-mounting position to mount the electric component. In view of this fact, one of the different control targets for establishing the predetermined relative position between the component-holding device and the board-supporting device is selected depending upon the specific pattern of control of the operating speed of the XY robot, that is, the specific pattern of control of the moving speed of the component-holding device, so that the positioning error of the electric component due to a varying degree of elastic deformation of the component-holding head and the supporting device can be reduced or prevented.

(3) An electric-component mounting system according to the above mode (1), wherein the first relative-movement device includes:

- a turning device holding a plurality of component-holding members of the component-holding device and operable to turn the component-holding members about a common axis of turning, to successively move the component-holding members to a predetermined component-mounting position; and
- a board-positioning device operable to move the board-holding device in the first direction, for bringing a selected position on the printed-wiring board into alignment with the component-mounting position in a plane parallel to the surface of the printed-wiring board supported by the board-supporting device.

The turning device may include an indexing body which holds the plurality of component-holding members and which is intermittently rotated, as described below with respect to the following mode (5) of the invention, so that the component-holding members are successively moved to the predetermined component-mounting position by an intermittent movement of the indexing body. Alternatively, the turning device includes a support structure, a cam device, and a plurality of movable members which carry the respective component-holding members and which are supported by the support structure such that the movable members can be turned by the cam device about a common axis of turning, at a speed controlled in a predetermined pattern, so that the moving members are successively moved to a plurality of working positions at different times, the component-holding members being supported by the respective movable members such that each component-holding member is rotatable about its axis and axially movable relative to the corresponding movable member.

The turning device may include a cam device which includes a cam and a cam follower and which is operated to intermittently turn the component-holding members about the common axis. Alternatively, the turning device is arranged to intermittently turn the component-holding members about the common axis, by intermittently operating an electric motor as a drive source.

The electric-component mounting system according to the above mode (3) is usually arranged such that the component-holding members are be turned by the turning device at a comparatively high speed, while the printed-wiring board is moved by the board-positioning device at a comparatively low speed. Accordingly, the electric component has a relatively large amount of positioning error due to elastic deformation of the corresponding component-holding member and the turning device upon stopping of the component-holding member following the movement by the turning device. This positioning error can be reduced or prevented by suitably selecting the control target used by the board-positioning device to position the printed-wiring board. Since the path of turning movement of each component-holding member by the turning device is held constant, the control target can be selected in a simpler manner than in the electric-component mounting system according to the above mode (2), which includes the XY robot. It is also noted that the mounting system according to the above mode (3) is generally operated at a higher speed, than the mounting system according to the above mode (2), so that the electric component mounted by the component-holding member has a relatively large amount of positioning error due to the above-indicated elastic deformation upon stopping of the component-holding member. In this respect, the positioning portion of the control device operable to select the suitable control target is particularly effective in the mounting system according to the above mode (3).

(4) An electric-component mounting system comprising:

- a component supply device operable to supply electric components;
- a plurality of component-holding members each arranged to hold the electric component supplied from the component supply device;
- a turning device holding the plurality of component-holding members and operable to turn the component-holding members about a common axis of turning, for successively moving the component-holding members to a predetermined component-mounting position;

a board-supporting/positioning device arranged to support a printed-wiring board on which the electric components are to be mounted, and operable to move the printed-wiring board in a plane parallel to a surface of the printed-wiring board, for bringing a selected position on the printed-wiring board into alignment with the component-mounting position in the above-indicated plane; and a control device including a positioning portion operable to select one of a plurality of different control targets which is used for the board-supporting/positioning device to move the selected position on the printed-wiring board to the component-mounting position, the positioning portion selecting the above-indicated one of the plurality of different control targets, depending upon a pattern of control of a speed of a turning movement of each of the component-holding members to the component-mounting position by the turning device.

The component supply device may include component feeders or trays. Each component feeder includes a component-accommodating portion accommodating the electric components, and a component-feeding portion operable to feed the electric component. For instance, the component-accommodating portion may be a carrier tape accommodating the electric components. In this case, the component-feeding portion may be a tape feeding device operable to feed the carrier tape, so that the electric components are successively fed to a component-supply portion. Alternatively, the component feeder is a bulk feeder including a container accommodating the electric components in bulk, and feeding means for successively feeding the electric components, by an air stream, a slope, vibration, etc. The component-accommodating portion and the component-feeding portion may be formed integrally with each other, or may be movable relative to each other.

The component-holding members held by the turning device are intermittently moved by an intermittent turning movement of the turning device, to move the electric components to the predetermined component-mounting position at which the electric components are mounted on the printed-wiring board. The pattern of control of the speed of the turning movement of each component-holding member may be determined by only the operating state of the turning device during the turning movement of the component-holding member, or by both of the operating state of the turning device during the turning movement of the component-holding member, and the operating state of the turning device during the stopping of the component-holding member.

(5) An electric-component mounting system according to the above mode (3) or (4), wherein the turning device includes an indexing body intermittently rotatable about the common axis of turning, and the positioning portion of the control device selects the above-indicated one of the plurality of different control targets according to at least one of a maximal value of a rotating speed of the indexing body and a deceleration value of the indexing body.

As the maximal rotating speed of the indexing body is increased, the centrifugal force acting on each component-holding member (acceleration and deceleration values of the component-holding device in the radial direction of the turning device) is accordingly increased, and the vibration of the component-holding member in the radial direction is accordingly increased. As the deceleration value of the indexing body is increased, the vibration in the tangential direction of the turning device is accordingly increased. Accordingly, the positioning error of the electric component at the component-mounting position varies with at least one of the maximal rotating speed and deceleration value of the indexing body, although the positioning error also varies with the other factors relating to the control of the turning speed of the turning device. However, the positioning error of the electric component is not necessarily increased with an increase in the maximal rotating speed and deceleration value of the indexing body, presumably because the electric component is not necessarily mounted on the printed-wiring board at the moment when at least one of the vibrations in the above-indicated two directions has the maximum amplitude, that is, the electric component may be mounted while the magnitude of the vibration or vibrations is being increased or reduced. It is also noted that the direction of the positioning error of the electric component is not constant. In view of the above, it is considered possible to improve the mounting accuracy of the electric component, by selecting the control target used to position the printed-wiring board, depending upon at least one of the maximal rotating speed and deceleration value of the indexing body.

(6) An electric-component mounting system according to the above mode (5), wherein at least one of the maximal value of the rotating speed and deceleration value of the indexing body is variable in a predetermined first number (integer $N \geqq 2$) of steps, while the positioning portion is operable to change the control target used to move the selected position, in a predetermined second number (integer M) of steps which is not larger than the predetermined first number.

(7) An electric-component mounting system according to the above mode (6), wherein the predetermined second number (M) is smaller than the predetermined first number (N).

The same control target may be used, that is, the second number (integer M) may be smaller than the first number (integer N), where the amount and direction of the positioning error of the electric component are the same or may be considered the same, when the speed of the turning movement of the component-holding member is controlled in different patterns.

(8) An electric-component mounting system according to any one of the above modes (3)–(7), wherein the control device includes memory means for storing the plurality of different control targets in relation to respective different patterns of control of a speed at which each of the component-holding members is turned by the turning device about the common axis of turning.

Each of the control targets stored in the memory means may be a combination of coordinate values of a control-target position to which the selected position on the printed-wiring board is moved by the board-supporting/positioning device, or a difference between the coordinate values of the control-target position and coordinate values of the component-mounting position.

(9) An electric-component mounting system according to any one of the above modes (1)–(3), wherein the control device further includes control-target determining portion operable to determine the plurality of different control targets which are selectively used to establish the predetermined relative position between the component-holding device and the board-supporting device.

(10) An electric-component mounting system according to any one of the above modes (4)–(8), wherein the control device further includes control-target determining portion operable to determine the plurality of different control targets which are selectively used to move the selected position on the printed-wiring board to the component-mounting position.

(11) An electric-component mounting system according to the above mode (9), wherein the control-target determining portion includes:

speed-control-pattern changing means for selecting one of a plurality of different patterns of control of a moving speed of the component-holding device;

test-chip mounting control means for operating the component-holding device to hold the test chips, moving the component-holding device in each of the plurality of different patterns of control of the moving speed, and operating the component-holding device to mount the test chips at respective test-chip mounting positions predetermined on the printed-wiring board;

an image-taking device operable to take images of the test chips as mounted by the test-chip mounting control means;

data processing means for processing image data representative of the images of the test chips, to obtain an amount and a direction of a positioning error of each of the test chips with respect to the test-chip mounting positions; and control-target determining means for determining the plurality of different control targets, on the basis of the amounts and directions of the positioning errors of the test chips obtained by the data processing means.

(12) An electric-component mounting system according to the above mode (10), wherein the control-target determining portion includes:

speed-control-pattern changing means for selecting one of a plurality of different patterns of control of the speed of the turning movement of the component-holding members;

test-chip mounting control means for operating the component-holding members to hold the test chips, moving the component-holding members in each of the plurality of different patterns of control of the turning speed, and operating the component-holding members to mount the test chips at respective test-chip mounting positions predetermined on the printed-wiring board;

an image-taking device operable to take images of the test chips as mounted by the test-chip mounting control means;

data processing means for processing image data representative of the images of the test chips, to obtain an amount and a direction of a positioning error of each of the test chips with respect to the test-chip mounting positions; and control-target determining means for determining the plurality of different control targets, on the basis of the amounts and directions of the positioning errors of the test chips obtained by the data processing means.

The test chips may be identical with the electric components to be mounted on the printed-wiring board in the present electric-component mounting system. Alternatively, the test chips may be prepared for the purpose of obtaining the control targets.

The test chips may be mounted at the respective test-chip mounting positions on the printed-wiring board which is supported by the board-supporting device and on which the electric components are to be mounted in the present mounting system. In this case, the test-chip mounting positions may or may not be the same as the component-mounting positions at which the electric components are mounted. Alternatively, the test chips may be mounted on a test substrate exclusively used for obtaining the control targets. The printed-wiring board or the test substrate on which the test chips are mounted may be located at a test-chip mounting position of the board-supporting device or board-supporting/positioning device, which is different from the component-mounting position of these devices.

The image-taking device may be a two-dimensional imaging device arranged to take a two-dimensional image of an object at one time, as described below in the DETAILED DESCRIPTION OF THE PREFERRED EMBODIMENTS, or a line sensor. The line sensor may consist of a straight array of image-taking elements, which is moved relative to the object to take successive lines of images which collectively constitute a two-dimensional image of the object.

(13) A method of mounting an electric component at a predetermined component-mounting position on a printed-wiring board supported by a board-supporting device, by moving a component-holding device holding the electric component and the board-supporting device, relative to each other in a direction parallel to a surface of the printed-wiring board, the method comprising the steps of;

moving the component-holding device and the board-supporting device relative to each other, by controlling a speed of relative movement thereof in each of a plurality of different patterns; and selecting one of a plurality of different control targets which is used for relative positioning of the component-holding device and the board-supporting device, depending upon one of the plurality of different patterns in which the component-holding device and the board-supporting device is moved relative to each other.

The technical feature according to any one of the above modes (2)–(12) of this invention is applicable to the method according to the above mode (13).

The electric-component mounting method according to the above mode (13) has substantially the same advantages as the electric-component mounting system according to the above mode (1), for example.

(14) A method of mounting electric components on a printed-wiring board, by turning a plurality of component-holding members holding the respective electric components, about a common axis of turning, to successively move the component-holding members to a predetermined component-mounting position, and moving a board-supporting/positioning device supporting the printed-wiring board thereon, in a plane parallel to a surface of the printed-wiring board, to bring a selected position on the printed-wiring board into alignment with the component-mounting position in the plane; and turning each of the component-holding members to the component-mounting position, by controlling a speed of a turning movement thereof in each of a plurality of different patterns; and selecting one of a plurality of different control targets which is used for moving the selected position on the printed-wiring board to the component-mounting position, depending upon one of the plurality of different patterns in which each component-holding member is turned.

The technical feature according to any one of the above modes (4)–(12) of this invention is applicable to the method according to the above mode (14).

The electric-component mounting method according to the above mode (14) has substantially the same advantages as the electric-component mounting system according to the above mode (3), for example.

BRIEF DESCRIPTION OF THE DRAWINGS

The above and other objects, features, advantages and technical and industrial significance of the present invention will be better understood by reading the following detailed description of presently preferred embodiments of the invention, when considered in connection with the accompanying drawings, in which:

FIG. 13 is a view indicating two sets of positioning errors of each of a plurality of suction nozzles, which correspond to respective two different rotating speeds of an indexing cam;

FIG. 14 is a view indicating estimated positioning errors which correspond to respective combinations of two rotating speeds of the indexing cam during movement and stopping of the component-holding head and which are used to adjust board-positioning data to eliminate actual positioning errors of the electric components mounted on the board;

DETAILED DESCRIPTION OF THE PREFERRED EMBODIMENTS

Figure 1:
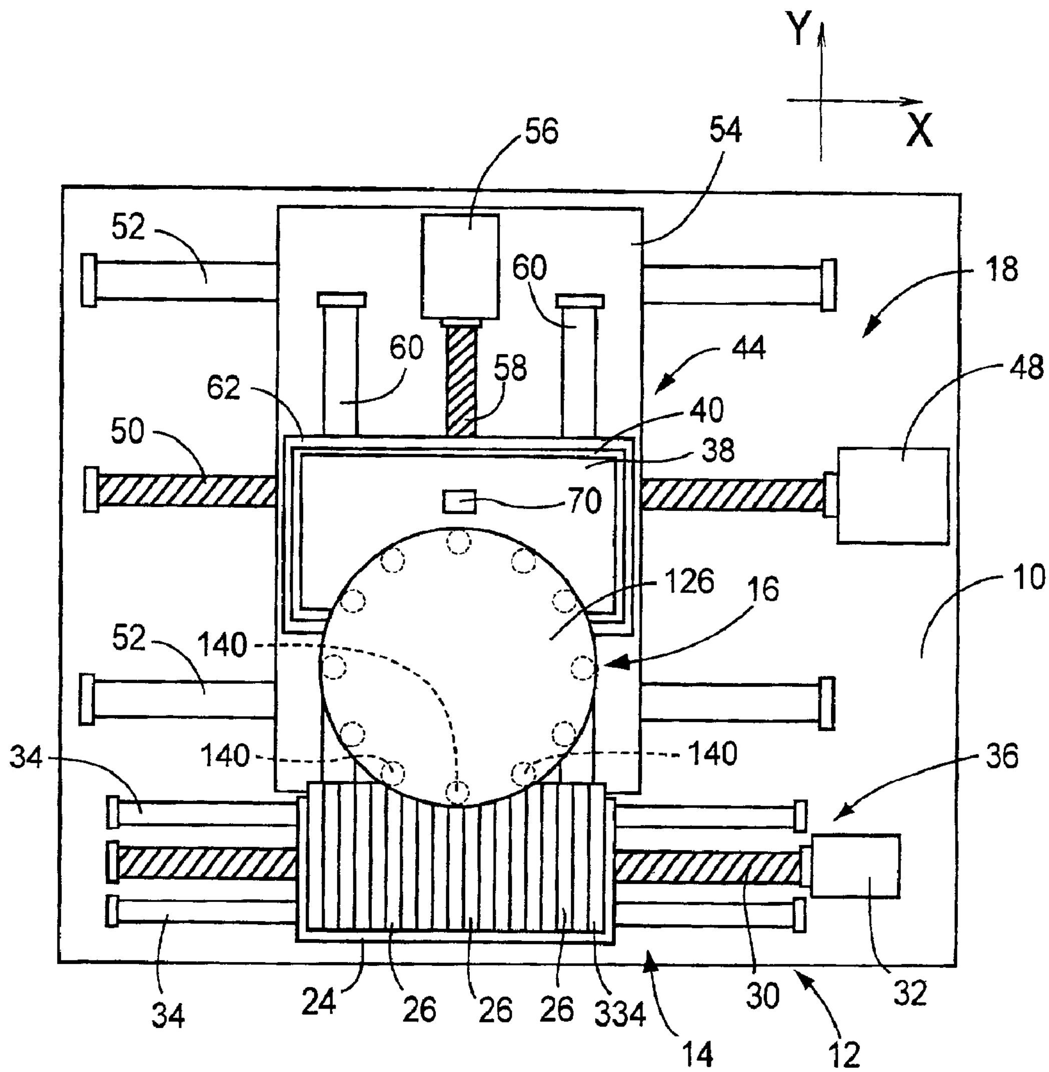
FIG. 1 is a plan view schematically showing an electric-component mounting system constructed according to one embodiment of this invention.

Referring first to FIG. 1, reference numeral 10 denotes a machine base of an electric-component mounting system 12, which includes a component supply device 14, a component mounting device 16 and a printed-board supporting and positioning device in the form of a printed-wiring-board supporting and positioning device 18, which are all mounted on the machine base 10.

Figure 5:
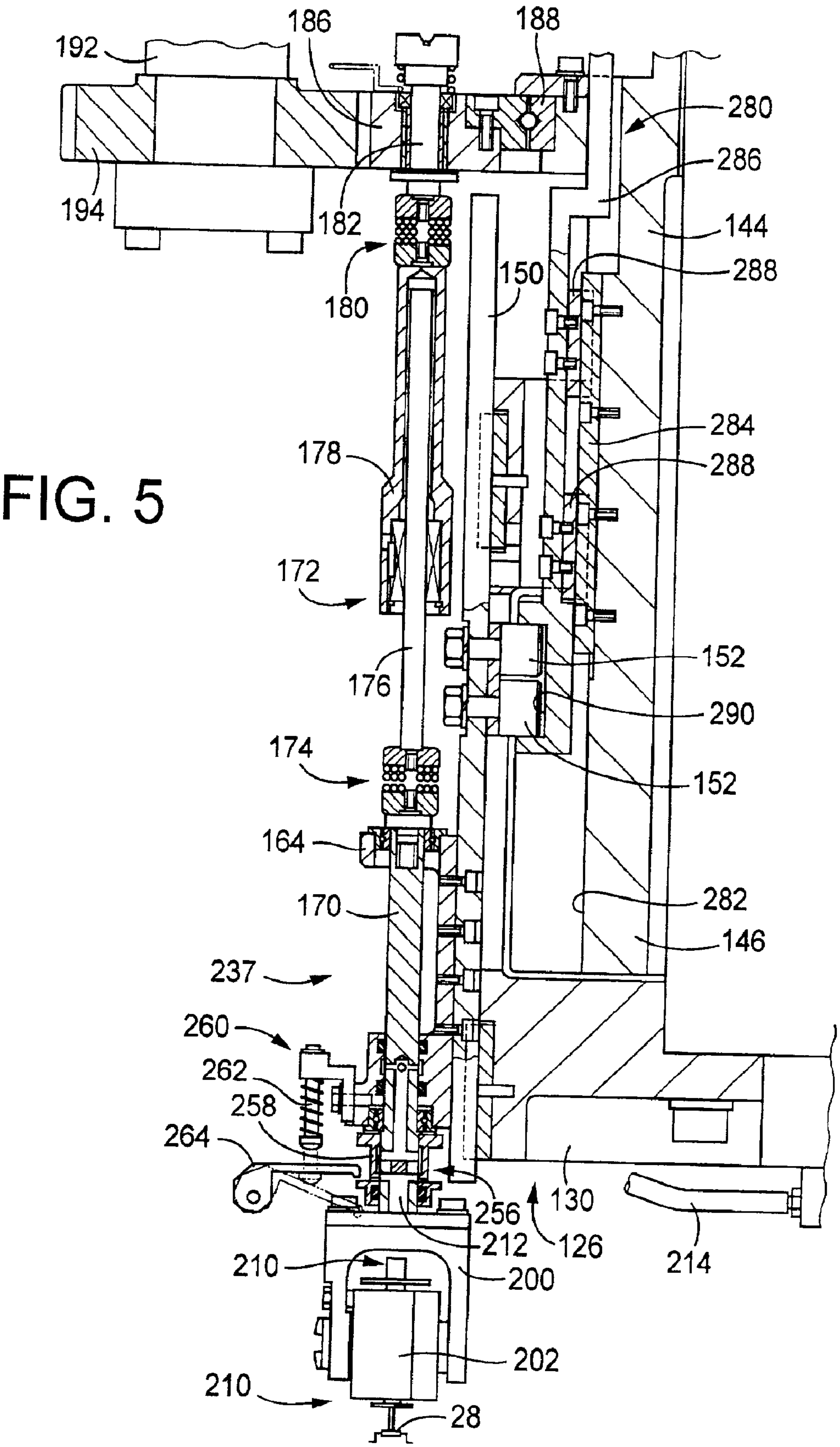
FIG. 5 is a front elevational view (partly in cross section) showing a part of a head lifting and lowering device of the component mounting device.

The component supply device 14 includes a plurality of tape feeders 26 mounted on a feeder support table 24. In the present embodiment, each of the tape feeders 26 is arranged to feed a carrier tape (not shown) which accommodates electric components (typically, electronic components) 28, one of which is shown in FIG. 5. The carrier tape includes a carrier substrate which has a multiplicity of component-accommodating recesses formed at a suitable interval along the length of the tape. The electric components 28 are accommodated in the respective component-accommodating recesses, and the opening of each recess is closed by a covering film bonded to the carrier substrate. The carrier tape is fed by a tape feeding device while the covering film is separated from the carrier substrate. Thus, the electric components 28 are fed one after another to a predetermined position at a component-supply portion of the tape feeder 26. The plurality of tape feeders 26 are removably mounted on the feeder support table 24 such that the component-supply portions of the tape feeders 26 are arranged along a straight line, namely, along a horizontal straight line in the present embodiment. The direction of extension of this straight line is referred to as an X-axis direction (right and left direction) as indicated in FIG. 1.

The feeder support table 24 is moved in the X-axis direction while being guided by a pair of guide rails 34, by rotation of a feedscrew in the form of a ballscrew 30 by a table drive motor 32, so that a selected one of the tape feeders 26 can be moved to a predetermined component-supply position. The ballscrew 30 and the table drive motor 32 cooperate to constitute a major portion of a table drive device.

The printed-wiring-board supporting and positioning device 18 (hereinafter referred to as "PWB supporting and positioning device") includes a board-supporting device in the form of a printed-wiring-board supporting device (hereinafter referred to as "PWB supporting device") 40 arranged to support the printed-wiring board 38 on which the electric components 28 are to be mounted, and a board-positioning device in the form of a printed-wiring-board positioning device (hereinafter referred to as "PWB positioning device") 44 arranged to move the PWB supporting device 40, for thereby positioning the printed-wiring board 38. The PWB positioning device 44 includes an X-axis slide 54, and a Y-axis slide 62 movably mounted on the X-axis slide 54. The X-axis slide 54 is movable in the X-axis direction by an X-axis drive motor 48 through a feedscrew in the form of a ballscrew 50 while being guided by guide rails 52, while the Y-axis slide 62 is movable in a Y-axis direction (perpendicular to the X-axis direction) by a Y-axis drive motor 56 through a feedscrew in the form of a ballscrew 58 while being guided by a guide rail 60. The PWB supporting device 40 rests on the Y-axis slide 62, on which is placed the printed-wiring board 38 such that the board 38 maintains a horizontal attitude or posture in which an upper surface or component-mounting surface 64 (FIG. 2) of the board 38 is parallel to an XX plane defined by the mutually perpendicular X-axis and Y-axis directions. The PWB supporting device 40 is moved the PWB positioning device 44 in the XY plane (horizontal plane parallel to the component-mounting surface 64), so that a selected portion of the surface 64 is located at a predetermined component-mounting position described below.

The printed-wiring board 38 is provided on its component-mounting surface 64 with a plurality of fiducial marks (not shown), two fiducial marks in this embodiment. The present electric-component mounting system 12 is provided with an image-taking device in the form of a stationary fiducial-mark camera 70, as shown in FIG. 1. The fiducial-mark camera 70 is arranged to take images of the fiducial marks on the printed-wiring board 38 as held by the PWB supporting device 40. The fiducial-mark camera 70 includes CCDs (charge-coupled devices) and a lens system. The CCDs are small-sized light-sensitive elements arranged in a matrix in a plane. Each of the light-sensitive elements generates an electric signal depending upon amount of light received. The matrix of the light-sensitive elements defines an imaging area in which a two-dimensional image of an object is formed at one time. An illuminating device (not shown) is provided near the fiducial-mark camera 70, to illuminate the object and its vicinity when the image of the object is taken by the camera 70.

Referring next to FIGS. 2–6, the component mounting device 16 will be described only briefly since the component mounting device 16 per se does not significantly relate to the present invention. The component mounting device 16 in the present embodiment is similar in construction to a component mounting device as disclosed in JP-A-6-342998, and co-pending U.S. patent application Ser. No. 09/863,431.

Figure 2:
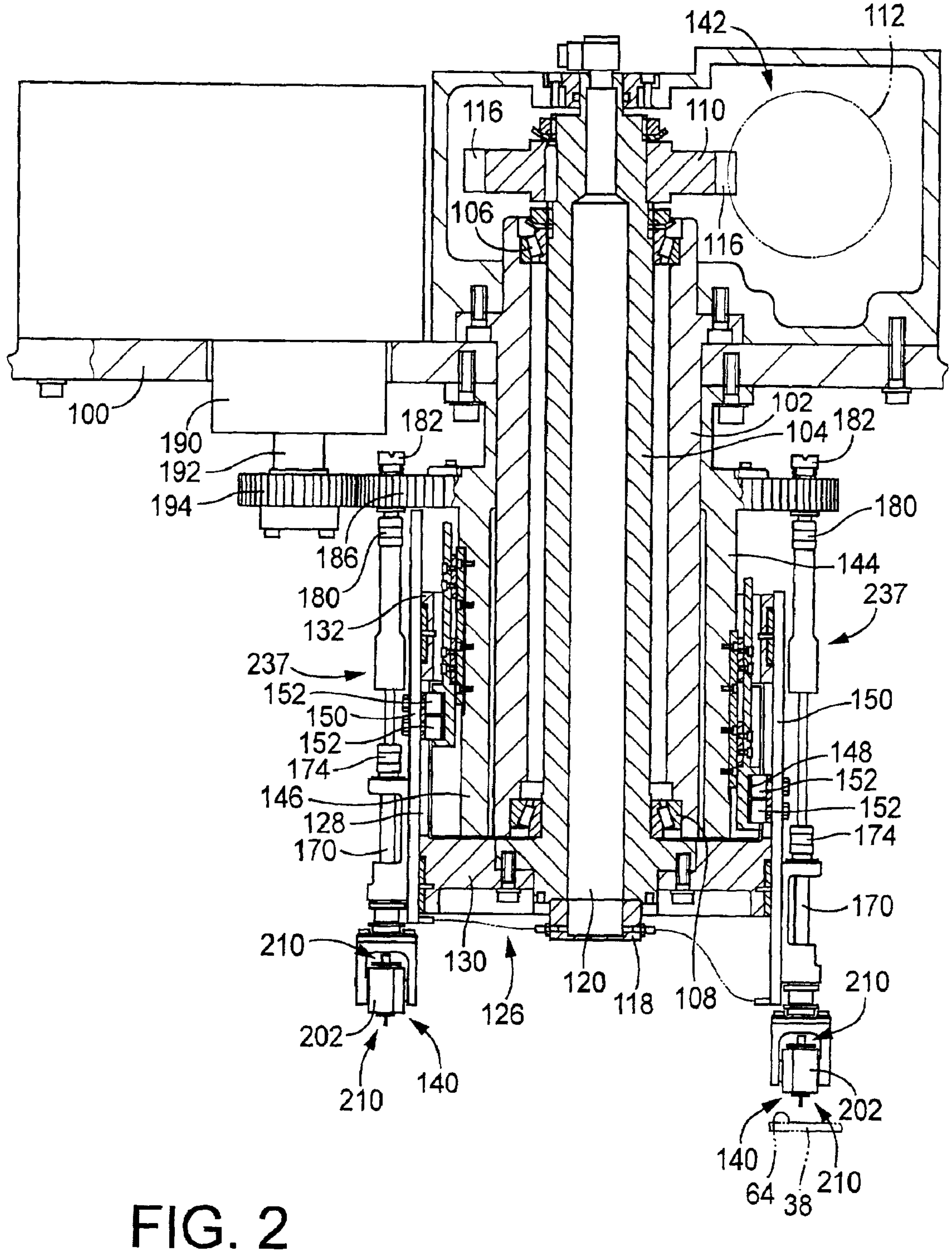
FIG. 2 is a front elevational view (partly in cross section) showing an electric-component mounting device of the electric-component mounting system of FIG. 1.
Figure 7:
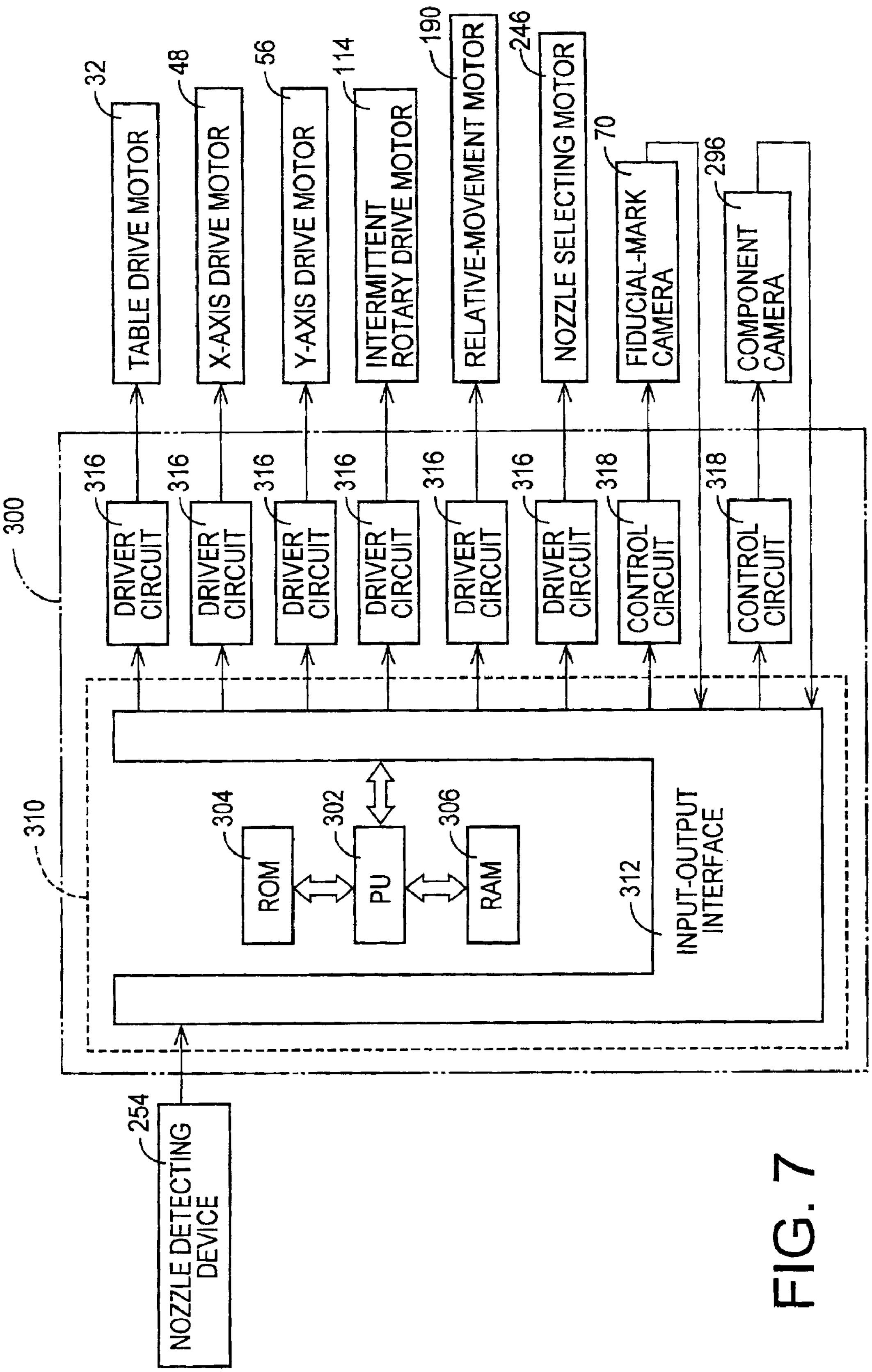
FIG. 7 is a block diagram illustrating a portion of a control device of the electric-component mounting system, which closely relates to the present invention.

In FIG. 2, reference numeral 100 denotes a frame supported by the machine base 10. On the frame 100, there is fixedly mounted a cylindrical member 102 extending in the vertical direction, such that the cylindrical member 102 is fixed at its upper portion on the frame 100, while its lower portion extends downwards from the frame 100. A rotary shaft 104 extends through a bore of the cylindrical member 102 and is supported by the cylindrical member 102 through bearings 106, 108, rotatably about its vertical axis. A roller gear 110 is attached an upper end portion of the rotary shaft 104 which extends upwards from the cylindrical member 102. The roller gear 110 has a plurality of rotatably supported rollers 116 which are sequentially engageable with a roller gear cam 112, when the roller gear cam 112 (hereinafter referred to as "cam 112") is rotated by a drive source in the form of an intermittent rotary drive motor 114 (FIG. 7) in a predetermined direction at a predetermined constant speed. Thus, the rotary shaft 104 is intermittently rotated about the vertical axis, by a predetermined angle for each intermittent rotary motion thereof. The lower open end of the rotary shaft 104 is closed by a covering member 118, and a bore of the rotary shaft 104 serves as a vacuum passage 120 connected to a negative-pressure source (not shown).

A rotating body in the form of an indexing body 126 is fixed to the lower end portion of the rotary shaft 104 which extends downwards from the cylindrical member 102. As shown in FIG. 2, the indexing body 126 includes a cylindrical portion 128, an annular disk portion 130, and a ring portion 132. The cylindrical portion 128 has an inside diameter larger than an outside diameter of the cylindrical member 104. The annular disk portion 130 is located adjacent to the lower end of the cylindrical portion 128, while the ring portion 132 is located adjacent to the upper end of the cylindrical portion 128.

Figure 3:
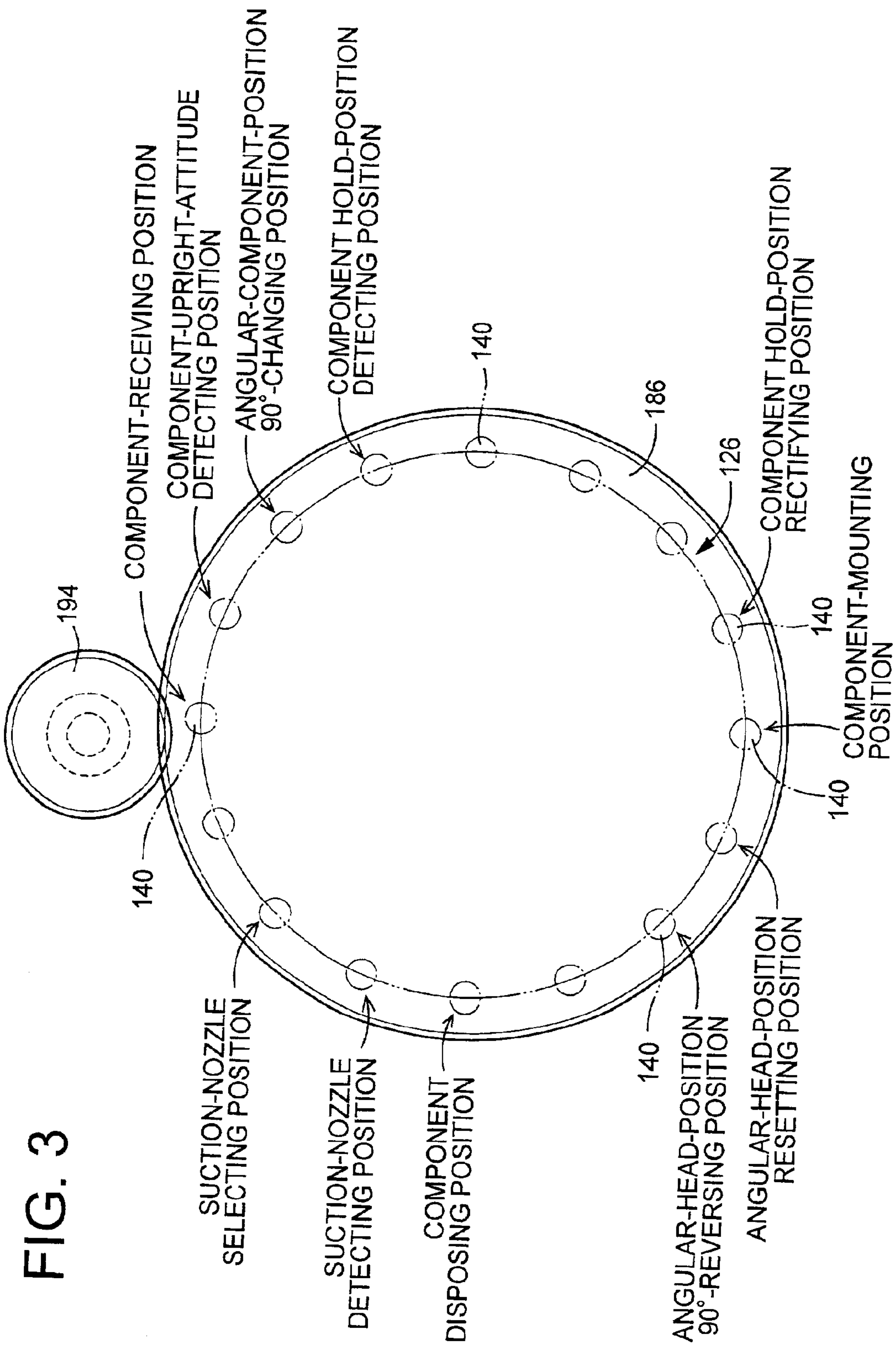
FIG. 3 is a view schematically showing working positions of component-holding heads of the electric-component mounting device of FIG. 2

As schematically shown in FIG. 3, the indexing body 126 carries a total of 16 component-holding devices in the form of 16 component-holding heads 140 arranged equiangularly along a circle having a center on the axis of rotation of the rotary shaft 104, and a total of 16 working stations or positions at which the 16 component-holding heads 140 are sequentially stopped. The 16 working positions include eight head-working positions at which each component-holding head 140 performs respective working operations. These eight working positions are: 1) component-receiving position (component-holding position or component-sucking position); 2) angular-component-position 90°-changing position; 3) component-hold-position rectifying position; 4) component-mounting position; 5) angular-head-position resetting position; 6) angular-head-position 90°-reversing position; 7) component disposing position; and 8) suction-nozzle selecting position. The 16 working positions include three detecting positions: a) component-upright-attitude detecting position; b) component-hold-position detecting position; and c) suction-nozzle detecting position. The 16 working positions include five unassigned positions. When the indexing body 126 is intermittently rotated, the 16 component-holding heads 140 are turned about a common axis, that is, about the vertically extending axis of rotation of the rotary shaft 104, so that each component-holding head 140 is sequentially stopped at the component-mounting position. In the present embodiment, the roller gear 110, cam 112 and intermittent rotary drive motor 114 cooperate to constitute an intermittently rotating device, which cooperates with the indexing body 126 and the rotary shaft 104 to constitute a head turning device 142, which cooperates with the PWB positioning device 44 to constitute a major portion of a first relative-movement device operable to move the component-holding heads 140 and the PWB holding device 40 relative to each other.

Figure 4:
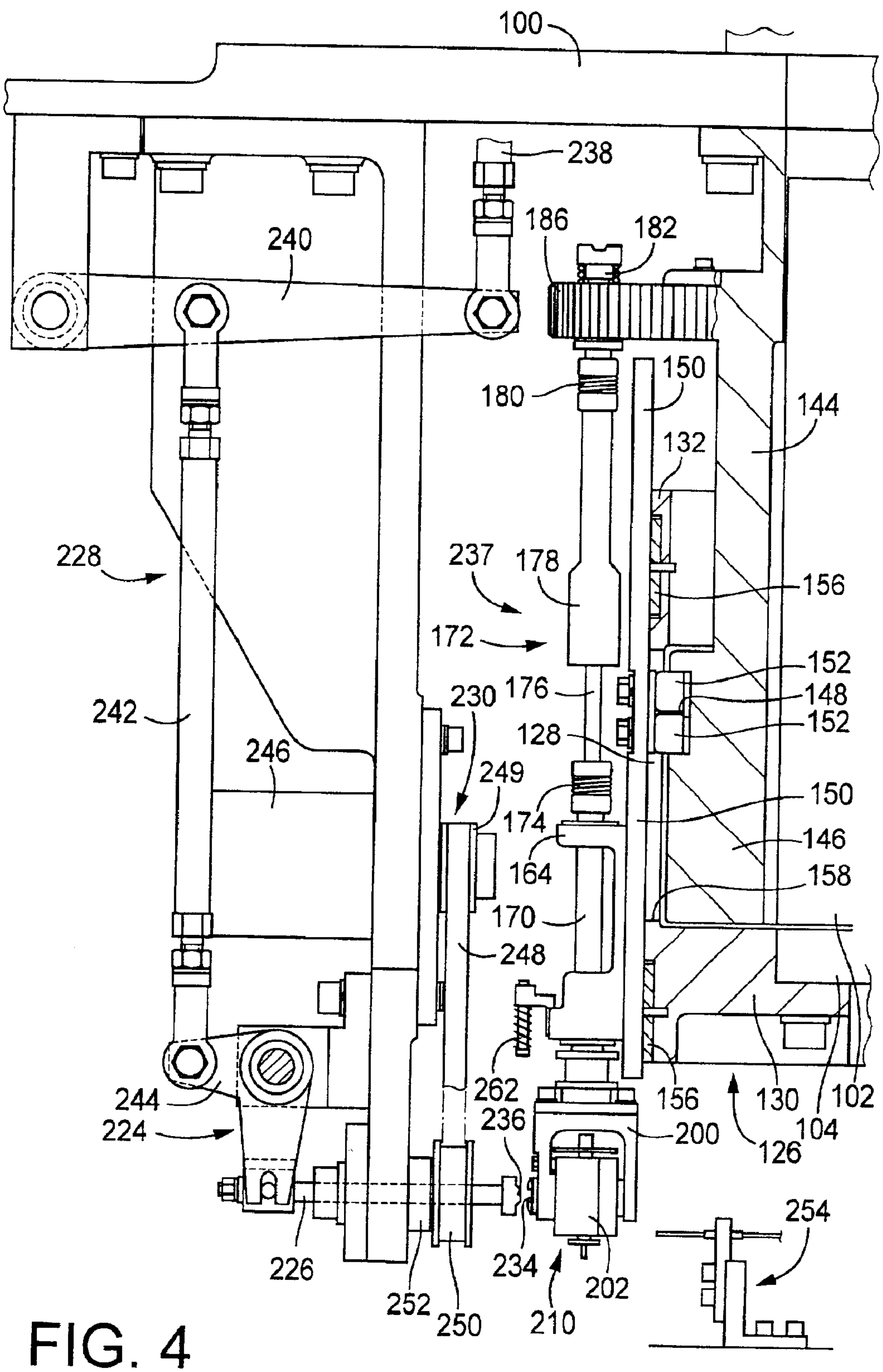
FIG. 4 is a front elevational view (partly in cross section) showing a component mounting unit and a nozzle selecting device of the component mounting device.

As shown in FIG. 2, a cylindrical cam 144 is attached to the underside of the frame 100, such that the cylindrical cam 144 is disposed radially outwardly of the cylindrical member 102, while a lower end portion of the cylindrical cam 144 is interposed between the indexing body 126 and the lower end portion of the cylindrical member 102. The cylindrical cam 144 is a stepped cylindrical member having a lower end portion consisting of a large-diameter portion 146 fitted in the cylindrical portion 128 of the indexing body 126. The large-diameter portion 146 has a cam groove 148 formed in its outer circumferential surface, as shown in FIGS. 2 and 4. A pair of rollers 152 rotatably attached to each of 16 vertically movable members in the form of plates 150 are held in engagement with the cam groove 148, extending through an elongate hole 158.

As shown in FIG. 4, a total of 16 pairs of guide blocks 156 are attached to the annular disk portion 130 and the ring portion 132 of the indexing body 126 such that the 16 pairs of guide blocks 156 are equiangularly spaced from each other in the circumferential direction of the indexing body 126. The two guide blocks 156 of each pair are spaced apart from each other in the axial direction of the indexing body 126, namely, in the vertical direction. The 16 vertically movable plates 150 are held in engagement with the respective pairs of guide blocks 156 such that each vertically movable plate 150 is vertically movable but is not movable in the circumferential or rotating direction of the indexing body 126. The 16 component-holding heads 140 are held by the respective 16 vertically movable plates 150.

The cam groove 148 is formed in the outer circumferential surface of the large-diameter portion 146 of the cylindrical cam 144, such that the height of the cam groove 148 gradually changes in the circumferential direction of the cylindrical cam 144, over selected two portions of the circumference of the cylindrical cam 144. When the component-holding heads 140 are turned with the vertically movable plates 150 about the axis of the indexing body 126, with an intermittent rotary motion of the indexing body 126, the pairs of rollers 152 are moved in the helical cam groove 148, so that the vertically movable plates 150 are vertically moved to vertically move the corresponding component-holding heads 140. The cam groove 148 is formed such that the component-holding head 140 located at the component-receiving position (component-holding or component-sucking position) is located at the uppermost position, while the component-holding head 140 located at the component-mounting position is located at the lowermost position. That is, each component-holding head 140 receives the electric component 28 from the appropriate tape feeder 26 when this head 140 is located at the component-receiving position and at the uppermost position. The component-holding head 140 is lowered to the lowermost position while this head 140 is turned to the component-mounting position at which the electric component 28 is mounted on the printed-wiring board 38. The height of the cam groove 148 remains unchanged over two other portions of the circumference of the cylindrical cam 144 other than the above-indicated selected two portions, so that each component-holding head 140 is turned without a vertical movement, along the above-indicated two other portions of the circumference of the cam 144, which are comparatively remote from the component-receiving and component-mounting positions in the rotating direction of the indexing body 126.

A vertically movable member in the form of a rod 170 is supported by a support member 164 attached to the outer surface of each of the vertically movable plates 150, as shown in FIG. 4, such that the vertically movable rod 170 is not axially movable relative to the support member 164 and is rotatable about its vertically extending axis. The vertically movable rod 170 is connected to a rotation transmitting shaft 172 to which a rotary motion is transmitted from each of: an angular-component-position 90°-changing device disposed at the angular-component-position 90°-changing position; a component hold-position rectifying device disposed at the component-hold-position rectifying position; an angular-head-position resetting device disposed at the angular-head-position resetting position; and an angular-head-position 90°-reversing device disposed at the angular-head-position 90°-reversing position. The component-holding head 140 is rotated about its axis by the vertically movable rod 170 when the rotary motion is transmitted from each of the above-indicated devices to the rod 170 through the rotation transmitting shaft 172. As shown in FIGS. 4 and 5, the rotation transmitting shaft 172 includes: a spline shaft 176 connected to the vertically movable rod 170 through a universal joint 174; a sleeve 178 fitted on the spline shaft 176 such that the sleeve 178 is axially movable relative to the spline shaft 176 but is not rotatable relative to the spline shaft 176; and an engaging member 182 connected to the sleeve 178 through a universal joint 180. The rotation transmitting shaft 172 is telescopically elongated and contracted through a relative axial movement of the spline shaft 176 and the sleeve 178.

The engaging member 182 of the rotation transmitting shaft 172 is held in meshing engagement with an externally toothed ring gear 186 such that the engaging member 182 is axially movable and rotatable relative to the ring gear 186. As shown in FIG. 5, the externally toothed ring gear 186 is mounted on the upper portion of the cylindrical cam 144 through a bearing 188 such that the ring gear 186 is rotatable about the axis of the indexing body 126.

The externally toothed ring gear 186 is held in meshing engagement with a drive gear 194 which is fixed to an output shaft 192 of a drive source in the form of a relative-movement motor 190 (shown in FIG. 2). The ring gear 186 is rotated by the relative-movement motor 190 about the axis of the indexing body 126, at an angular velocity different from that of the indexing body 126.

Figure 6:
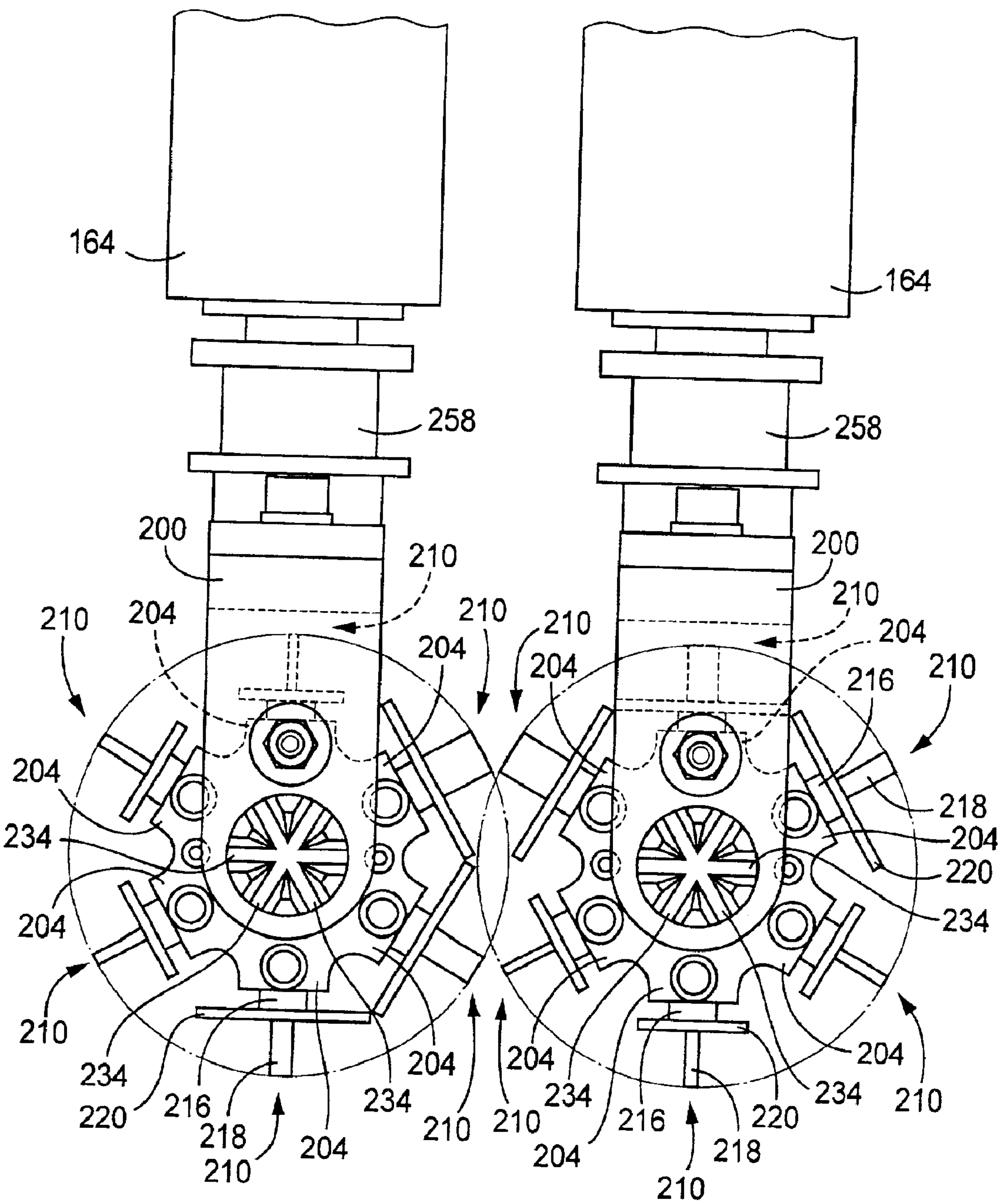
FIG. 6 is a front elevational view showing two component mounting units of the component mounting device, each unit having six suction nozzles.

As shown in FIGS. 4 and 5, a support member 200 is removable attached to the lower end portion of the vertically movable rod 170. The support member 200 supports a component-holder support member in the form of a nozzle holder 202 such that the nozzle holder 202 is rotatable about a horizontal axis perpendicular to the axis of rotation of the indexing body 126. The nozzle holder 202 has six nozzle-holding portions 204 that are equiangularly spaced from each other in the rotating direction of the nozzle holder 202, as shown in FIG. 6. Each nozzle-holding portion 204 is arranged to hold a component holder in the form of a suction nozzle 210. Thus, the six suction nozzles 210 are removably held by the nozzle holder 202 such that the suction nozzles 210 extend in the radial direction of the nozzle holder 202 and are arranged at a predetermined angular interval in the rotating direction of the nozzle holder 202. In FIGS. 2, 4 and 5, only the two suction nozzles 210 are shown, in the interest of brevity. Each suction nozzle 210 is arranged to hold the electric component 28 by suction under a negative pressure. The nozzle holder 202 has a passage (not shown) communicating with the above-indicated vacuum passage 120 through a passage 212 formed through the vertically movable rod 170, and a hose 214 (shown in FIG. 5).

As shown in FIG. 6, each suction nozzle 210 has a nozzle body 216, a suction tube 218 and a light-emitting body in the form of a light-emitting plate 220 serving as a light emitting member. The light-emitting plate 220 absorbs a ultraviolet radiation received from a ultraviolet-radiation emitting device disposed at the component-hold-position detecting position, and emits a visible light. The suction tube 218 and the light-emitting plate 220 of each suction nozzle 210 have sizes suitable for the particular kind or type of the electric component 28 (FIG. 5). The six suction nozzles 210 are used to hold the electric components 28 having respective different sizes (different height dimensions and/or masses), and the suction tubes 218 of the six suction nozzles 210 have respective different diameters. In the present embodiment, all of the six suction nozzles 210 are different from each other in the diameter of the suction tubes 218. It is noted that the suction tubes 218 have the same length.

The nozzle holder 202 is rotated by a nozzle selecting device 224 disposed at the suction-nozzle selecting position, as shown in FIG. 4. The nozzle-holder selecting device 224 includes a rotary drive rod 226, a switching device 228 and a rod rotating device 230. As shown in FIG. 6, the nozzle holder 202 has an engaging portion in the form of three engaging grooves 234 formed so as to intersect with each other at the axis of rotation of the nozzle holder 202. On the other hand, the rotary drive rod 226 has engaging teeth 236 which are engageable with the engaging grooves 234. When the rotary drive rod 226 is rotated with its engaging teeth 236 engaging the engaging grooves 234, the nozzle holder 202 is rotated to bring a selected one of the six suction nozzles 210 to its operating position in which the suction nozzle 210 extends in the vertical direction, with the suction tube 218 being open downwards. The axis of the suction nozzle 210 placed in the operating position is aligned with the axis of the vertically movable rod 170. It will be understood that the component-holding head 140 is constituted by the suction nozzle 210 placed in the operating position, the nozzle holder 202 holding this suction nozzle 210, and the vertically movable rod 170, and that the component-holding head 140 and the other suction nozzles 210 placed in their non-operating position cooperate to constitute a component-mounting unit or component-holding unit 237. Each suction nozzle 210 may be considered to be a part of the component-holding head. In this case, the component-mounting device 16 is considered to have a total of 96 component-holding heads, namely, six component-holding heads 140 held by each of the 16 nozzle holders 202.

The rotary drive rod 226 is selectively connected to and disconnected from the nozzle holder 202 through a switching device 228, which is driven by the intermittent rotary drive motor 114. The switching device 228 includes a lifting and lowering rod 238 which is connected to the rotary drive motor 114 through a motion-converting mechanism which includes a cam, a cam follower, and a motion-transmitting mechanism supporting the cam follower. The motion-converting mechanism is arranged to convert a rotary motion of the rotary drive motor 114 into a linear motion of the lifting and lowering rod 238. Since the rotary drive motor 114 is kept operated, the lifting and lowering rod 238 is lowered only when the nozzle holder 202 is rotated to select one of the six suction nozzles 210. The motion-converting mechanism is constructed as in an electronic-component mounting system disclosed in JP-B-3050638. The lifting and lowering rod 238 is connected to the rotary drive rod 226 through lever 240, a connecting rod 242 and a lever 244. When the rod 238 is vertically moved, the lever 240 is pivoted to vertically move the connecting rod 242, so that the lever 244 is pivoted to move the rotary drive rod 226 between an operated position in which the engaging teeth 236 engage the engaging grooves 234 of the nozzle holder 202, and a non-operated position in which the engaging teeth 236 are released from the engaging grooves 234. nozzle-selecting motor 246 as a drive source, as shown in FIG. 4. The rotary drive rod 226 is supported by a casing 252 such that the rotary drive rod 226 is axially movable relative to the casing 252 and is rotated with the casing 252. A rotary motion of the nozzle-selecting motor 246 is transmitted to the casing 252 through a timing belt 248 and two timing pulleys 249, 250, so that the rotary drive rod 226 is rotated about its axis, to rotate the nozzle holder 202 about its axis, for bringing a selected one of the six suction nozzles 210 into its operating position. The suction nozzles 210 have respective passages formed therethrough. The passage of the selected suction nozzle 210 placed in its operating position is communicated with the passage formed through the nozzle holder 202, so that a negative pressure can be applied to the selected suction nozzle 210. The nozzle holder 202 is positioned by a positioning device (not shown) such that the suction nozzle 210 selected for mounting the electric component 28 is placed in the operating position.

The nozzle-selecting motor 246 used in the present embodiment is an electric motor in the form of a servomotor serving as a rotary electric motor. The servomotor is a motor whose operating amount or angle can be controlled with a comparatively high degree of accuracy. The servomotor may be replaced by a stepping motor. The nozzle-selecting device 224 using the servomotor as the nozzle-selecting motor 246 permits the nozzle holder 202 to be rotated in a selected one of clockwise and counterclockwise directions by an appropriate angle to select the desired suction nozzle 210. In the present embodiment, the nozzle holder 202 is rotated in increments of 60°, from the present angular position to the angular position for selecting the desired suction nozzle 210, by up to 180° in a selected one of the clockwise and counterclockwise directions. The kind of the suction nozzle 210 presently placed in the operating position is detected by a nozzle detecting device 254 (shown in FIG. 4). The direction and angle of rotation of the nozzle holder 202 to select the desired suction nozzle 210 are determined on the basis of the detected kind of the suction nozzle presently placed in the operating position and the kind of the desired suction nozzle 210.

The nozzle detecting device 254 is arranged to detect the nozzle holding portion 204 which holds the suction nozzle 210 presently placed in the operating position. A relationship between the nozzle holding portions 204 and the kinds of the suction nozzles 210 held by the respective nozzle holding portions 204 is represented by data stored in a control device 300 which will be described. According to this relationship, the kind of the suction nozzle 210 placed in the operating position can be obtained on the basis of the detecting the corresponding nozzle holding portion 204 of the nozzle holder 202. As described below, the nozzle holding portions 204 are provided with respective identification codes, which are read by the nozzle detecting device 254.

As shown in FIG. 5, the lifting and lowering rod 170 is provided with a switch valve 256 arranged to selectively communicate the suction nozzle 210 with the negative-pressure source or the atmosphere. The switch valve 256 includes a switching sleeve 258 axially movably fitted on the lifting and lowering rod 170. The switching sleeve 258 is axially movable by a switching device 260, between its uppermost position as an atmospheric-pressure position in which the suction tube 218 of the suction nozzle 210 placed in the operating position is communicated with the atmosphere, and its lowermost position as a negative-pressure position in which the suction tube 218 is communicated with the negative-pressure source. The switching device 260 includes a pusher pin 262 attached to the support member 164, a pusher lever 264 provided at the component-receiving position, and a bar (not shown) provided at the component-mounting position. The switching sleeve 258 of the switch valve 256 is mechanically moved in its axial direction by the switching device 260, relative to the lifting and lowering rod 170, when the component-holding head 140 is vertically moved as a result of its turning movement about the axis of the indexing body 126 between the component-receiving position and the component-mounting position. Described more specifically, the switching sleeve 258 is placed in its negative-pressure position when the component-holding head 140 is placed in the component-receiving position, so that the suction tube 218 is communicated with the negative-pressure source, for holding the electric component 28 by suction under the negative pressure. When the component-holding head 140 has been moved to the component-mounting position, the switching sleeve 258 is moved to its atmospheric-pressure position for communicating the suction tube 218 with the atmosphere, for releasing the electric component 28. The switching sleeve 258 is held in its negative-pressure position while the component-holding head 140 is moved from the component-receiving position to the component-mounting position, so that the electric component 28 is kept held by the suction tube 218 until the electric component 28 has reached the component-mounting position.

As indicated above, the angular-component-position 90°-changing device, component hold-position rectifying device, angular-head-position resetting device and angular-head-position 90°-reversing device are disposed at the angular-component-position 90°-changing position, component hold-position rectifying position, angular-head-position resetting position and angular-bead-position 90°-reversing position, respectively. Each of these devices includes: an engaging member engageable with and disengageable from the rotation transmitting shaft 172 of each component-holding head 140; a connecting device for selective engagement with or disengagement from the rotation transmitting shaft 172; and a rotating device for rotating the engaging member. The connecting device uses the intermittent rotary drive motor 114 as a drive source, a rotary motion of which is converted into a linear vertical motion of the engaging member by a motion-transmitting or motion-converting device including a cam and a cam follower.

The rotating device of each of the component hold-position rectifying device and the angular-head-position resetting device uses an exclusive servomotor as a drive source, for rotating the engaging member by a desired angle in a selected one of the clockwise and counterclockwise directions. The rotating device of each of the angular-component-position 90°-changing device and the angular-head-position 90°-reversing device uses the intermittent rotary drive motor 114 as a drive source, a rotary motion of which is converted into a 90° rotation of the engaging member in a selected one of the clockwise and counter-clockwise directions, by a motion-converting or motion-transmitting device, which is constructed as disclosed in JP-B2-3050638.

The cylindrical cam 144 attached to the frame 100 has two axially moving devices in the form of two head lifting and lowering devices 280 at respective circumferential positions corresponding to the component-receiving and component-mounting positions, as shown in FIG. 5 (in which there is shown only the head lifting and lowering device 280 corresponding to the component-receiving position). These head lifting and lowering devices 280, which are arranged to vertically move the component-holding heads 140, have the same construction. Only the head lifting and lowering device 280 corresponding to the component-receiving position will be described by way of example.

The cylindrical cam 144 has a guide groove 282 formed in a circumferential portion thereof corresponding to the component-receiving position such that the guide groove 282 extends vertically in the axial direction of the indexing body 126. To the bottom surface of a vertically intermediate part of the guide groove 282, there is fixed a guide member in the form of a guide plate 284. Two guide blocks 288 fixed to a vertically movable member 286 are held in sliding contact with the guide plate 284. The vertically movable member 286 has a width substantially equal to that of the guide groove 282, for engagement with the guide groove 282. The lower end portion of the vertically movable member 286 has an engagement groove 290 which is open in the radially outward direction of the cylindrical cam 144 and which extends in the horizontal direction. The engagement groove 290 has the same width (dimension in the axial direction of the indexing body 126) as that of the cam groove 148. Like the lifting and lowering rod 238 of the nozzle selecting device 224, the vertically movable member 286 is vertically moved by a motion-transmitting or motion-converting mechanism, which includes a cam and a cam follower and which is arranged to convert a rotary motion of the intermittent rotary drive motor 114 into a linear vertical motion of the vertically movable member 286 when the component-holding head 140 is required to be vertically moved. Namely, the component-holding head 140 is vertically moved by the vertical movement of the vertically movable member 286, in the vertical direction toward and away from the component-mounting surface 64 of the printed-wiring board 38. Thus, the head lifting and lowering device 280 serves as a second relative-movement device arranged to move the component-holding head 140 and the printed-wiring board 38 (PWB holding device 40) relative to each other, namely, toward and away from each other in the vertical direction.

The cam follower of the motion-transmitting mechanism of the head lifting and lowering device 280 is movable between an operable position for engagement with the cam, and an inoperable position spaced apart from the cam. When the cam follower is placed in its inoperable position when the component-holding head 140 is located at the component-receiving or component-mounting position, the head 140 does not perform its action to receive the electric component 28 or mount the electric component 28 on the printed-wiring board 38.

At the component hold-position detecting position, a component camera 296 (indicated in FIG. 7) is disposed for taking an image of the electric component 28 as held by the suction nozzle 210 of the component-holding head 140 located at the component hold-position detecting position. Like the fiducial-mark camera 70, the component camera 296 provided in the present embodiment is a two-dimensional imaging device using CCDs. The component camera 296 fixedly disposed at the component hold-position detecting position (lying in a circle along which the component-holding head 140 is turned) is oriented so as to face upwards, that is, toward the lower end face of the suction tube 218. The ultraviolet emitting device described above with respect to the light-emitting plate 220 is disposed near the component camera 296, and cooperates with the light-emitting plate 220 of the suction nozzle 210 to constitute an illuminating device.

The present electric-component mounting system includes the above-indicated control device 300, which is principally constituted by a computer 310 incorporating a processing unit (PU) 302, a read-only memory (ROM) 304, a random-access memory (RAM) 306, and a bus interconnecting those elements. The bus is connected to an input-output interface 312 to which are connected various sensors such as the nozzle detecting device 254. To the input-output interface 312, there are also connected various actuators including the table drive motor 32, X-axis drive motor 48, Y-axis drive motor 56, intermittent rotary drive motor 114, relative-movement motor 190, and nozzle selecting motor 246 through respective driver circuits 316. Like the nozzle selecting motor 246 described above, the other motors such as the motor 32 are servomotors whose operating amounts are detected by respective rotary encoders and which are controlled on the basis of the output signals of the rotary encoders.

To the input-output interface 312, there are also connected the fiducial-mark camera 70 and the component camera 296 through respective control circuits 318. The RAM 306 stores various control programs and data such as component-mounting control programs for mounting the electric components 28 on the printed-wiring boards 38, positioning-error detecting control programs for obtaining the amounts and directions of positioning errors of the electric components 28 with respect to the nominal component-mounting positions on the printed-wiring boards 38, depending upon different patterns of control of the speed of turning movement of the component-holding heads 140.

There will next be described an operation of the present electric-component mounting system constructed as described above. The 16 component-holding heads 140 are intermittently turned with an intermittent rotary movement of the indexing body 126, and temporarily stopped at the 16 working positions, so that the electric component 28 is held by the component-holding head 140 located at the component-receiving position, and is mounted on the printed-wiring board 38 when the same component-holding head 140 is moved to the component-mounting position. Further, the position of the printed-wiring board 38 at which an operation to mount each electric component 28 is performed is adjusted or compensated, depending upon the pattern of control of the speed of turning movement of the component-holding head 140 and the kind of the suction nozzle 210 used for mounting the electric component 28 on the board 38. Initially, there will be described a basic operation to mount the electric component 28 on the printed-wiring board 38. Then, there will be described operations to obtain and correct the positioning errors of the electric component 28 with respect to the nominal mounting position, depending upon the pattern of control of the turning movement of the component-holding head 140 and the kind of the electric component 28.

Different kinds of positioning errors of the electric component 28 held by each of the 16 component-holding heads 140 are detected at the three working positions, and the component-holding heads 140 located at the respective eight working positions perform respective different operations concurrently with each other. The operations performed by each component-holding head 140, which will be described only briefly, are identical with those as disclosed in JP-A-6-342998.

When the component-holding head 140 is moved with an intermittent rotary motion of the indexing body 126, the engaging member 182 of the rotation transmitting shaft 172 is rotated independently of the indexing body 126, such that the engaging member 182 reaches each working station before the component-holding head 140. A relative movement between the engaging member 182 and the component-holding head 140 will be explained by reference to the time chart of FIG. 8.

Figure 8:
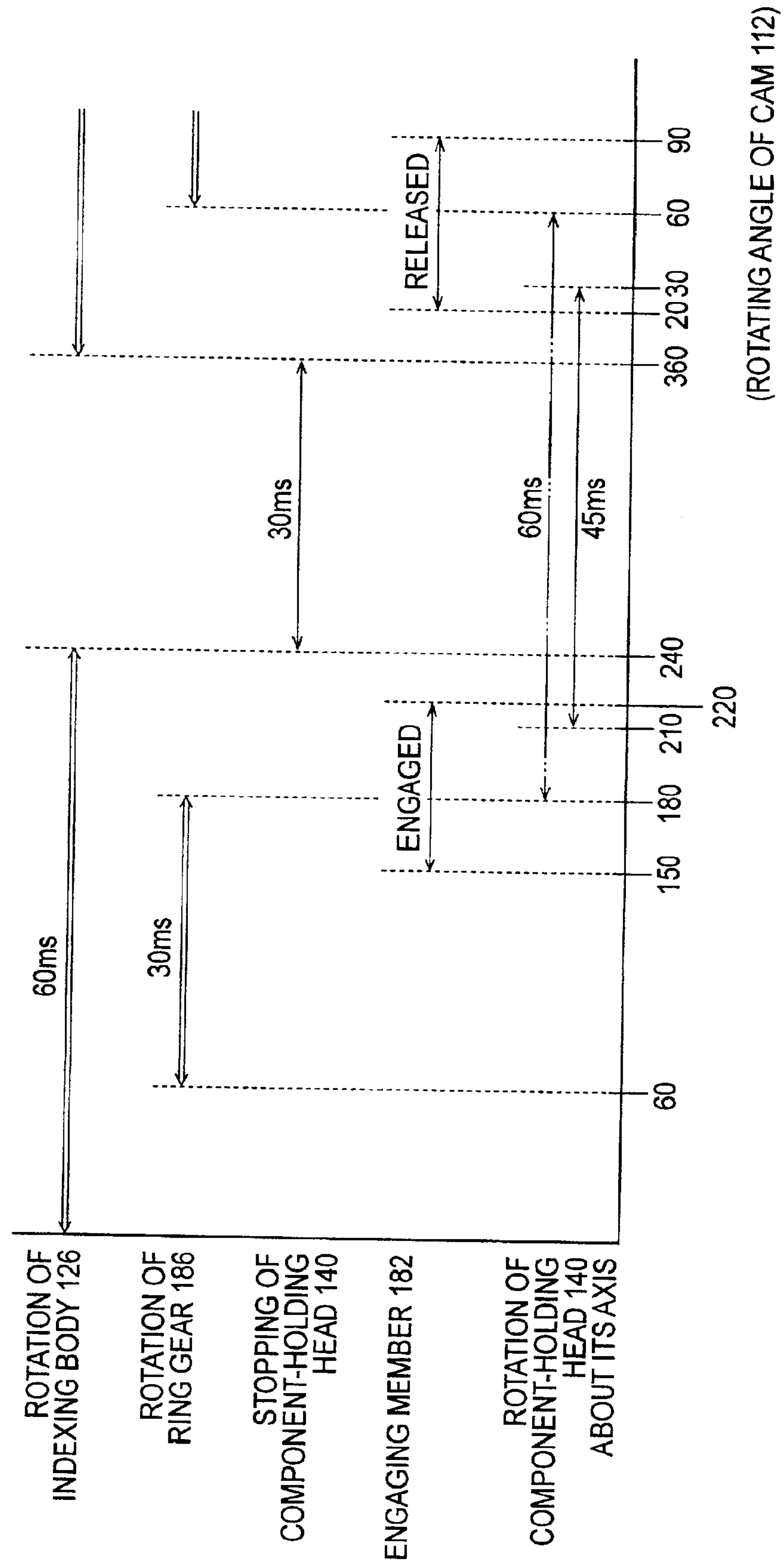
FIG. 8 is a time chart for explaining a non-relative-movement state of engaging member 182, and operation of component-holding head 140 in the non-relative-movement state

As described below, the component-holding head 140 is not turned in a predetermined constant pattern of control of the turning speed, but is turned in a selected one of different patterns of control of the turning speed, more precisely, in a selected one of different combinations of a time duration for which the head 140 is turned, and a time duration for which the head 140 is stopped at each working position. The pattern of control of the turning speed of the component-holding head 140 can be changed by changing the rotating speed of the cam 112. The relative movement between the engaging member 182 and the component-holding head 140 illustrated in FIG. 8 is the one when the earn 112 is rotated at a speed which is 80% of the maximum rotating speed, while the head 140 is turned between the adjacent working positions and is held stopped at each working position. The angle indicated in the time chart of FIG. 8 is the angle of rotation of the cam 112 to rotate the indexing body 126. One full rotation of the cam 112 causes each component-holding head 140 to be moved from one working position to the next adjacent working position and held at this latter working position.

When the cam 112 has been rotated by 60° to rotate the indexing body 126, the rotation of the externally toothed ring gear 186 is initiated. The component-holding head 140 is moved in an initial portion of the rotation of the indexing body 126, during which the externally toothed ring gear 186 of the rotation transmitting shaft 172 is held stopped. The ring gear 186 is rotated until the cam 112 has been rotated by 180°, that is, for a time duration of 30 ms. Since the angular velocity of the ring gear 186 is two times that of the indexing body 126, the engaging member 182 is moved from one working position to the adjacent working position in 30 ms while the component-holding head 140 is moved between those two working positions in 60 ms. Accordingly, the engaging member 182 whose movement has been initiated after the movement of the head 140 leads the head 140 during the movements of the engaging member 182 and head 140, and reaches the adjacent working position before the head 140 while the head 140 is still being moved with the indexing body 126.

A movement of the engaging member 182 relative to the component-holding head 140 in the rotating direction of the indexing body 126 is permitted by the universal joints 174, 180. The component-holding head 140 is vertically moved while the indexing body 126 is rotated and the component-holding head 140 is turned about the axis of the indexing body 126. This vertical movement of the component-holding head 140 is permitted by a relative movement between the spline shaft 176 and the sleeve 178.

The relative movements indicated above establish a non-relative-movement state for each of the angular-component-position 90°-changing position, component hold-position rectifying position, angular-head-position resetting position and angular-head-position 90°-reversing position. In this non-relative-movement state, the engaging member 182 is not moved in the rotating direction of the indexing body 126 during the rotation of the indexing body 126, relative to the engaging member of the corresponding one of the angular-component-position 90°-changing device, component hold-position rectifying device, angular-head-position resetting device and angular-head-position 90°-reversing device.

The non-relative-movement state is established for a total time period of 60 ms including a time length of the terminal portion of one rotation of the cam 112 (during a rotary motion of the cam 112 from the 180° position to the 240° position), and a time length of the initial portion of another rotation of the cam 112 (during a rotary motion of the cam 112 from the 0° position to the 60° position). In an intermediate portion (30 ms) of the total time period of 60 ms of the non-relative-movement state, the component-holding head 140 is turned with the rotary motion of the indexing body 126, but the engaging member 182 is already located at the working position and is held in engagement with the engaging member of the appropriate working device such as the component hold-position rectifying device, so that the rotation transmitting shaft 172 is rotated to rotate the component-holding head 140, to perform the appropriate operation such as an operation to rectify the positioning error of the component 28 as held by the head 140.

The non-relative-movement state is maintained for the total time period of 60 ms as indicated by two-dot chain line in the time chart of FIG. 8. In this time period, the engaging member 182 is engaged with and released from the engaging member of the appropriate working device such as the component hold-position rectifying device, and the component-holding head 140 is rotated by the shaft 172 to perform the appropriate operation. The time period of 60 ms of the non-relative-movement state consists of a time length of 30 ms during which the component-holding head 140 is held at the appropriate working station, and the total time length of 30 ms of the above-indicated initial and terminal portions of one rotation of the cam 112. Accordingly, the length of time available for the working device to perform the appropriate working operation in the present electric-component mounting system is doubled as compared with the length of time in the conventional system in which the working operation must be performed while the component-holding head 140 is held stopped at the appropriate working position. The present arrangement provides a sufficient time for each working device to perform the appropriate working operation (e.g., operation to rectify the positioning error of the component 28), without having to increase the speed of rotation of the indexing body 126 for reducing the time required for the component-holding head 140 to reach each working position.

Then, the working operations performed by each component-holding head 140 at the individual working positions will be described. The component-holding head 140 first receives the electric component 28 from the presently selected tape feeder 26, at the component-receiving position. Namely, the head 140 located at the component-receiving position is lowered by the head lifting and lower device 280, and the negative pressure is applied to the suction nozzle 210, to hold the electric component 28 by suction under the negative pressure. Then, the head 140 is lifted by the device 280, and is then moved with a rotary movement of the indexing body 126, to the component-upright-attitude detecting position at which the component-upright-attitude detecting device (not shown) determines whether the electric component 28 held by the suction nozzle 210 has an upright attitude in which the electric component 28 is not sucked at one of its opposite major surfaces. If the electric component 28 has the upright attitude, this electric component 28 is not mounted on the printed-wiring board 38 at the component-mounting position, and is discarded at the component-disposing position.

From the component-upright-attitude detecting position, the component-holding head 140 is moved to the angular-component-position 90°-changing position at which the head 140 is rotated clockwise or counterclockwise by 90° by the angular-component-position 90°-changing device, if the angular position in which the electric component 28 is mounted on the printed-wiring board 38 is different by 90° from the angular position in which the electric component 28 has been held by the suction nozzle 210. Then, the head 140 is moved to the component hold-position detecting position at which an image of the electric component 28 as held by the suction nozzle 210 is taken by the component camera 296. Image data representative of the taken image are compared with stored image data representative of nominal horizontal and angular positions of the electric component 28, to obtain horizontal positioning errors ΔXE and ΔYE and an angular positioning error Δθ of the electric component 28 as held by the suction nozzle 210. The horizontal positioning errors are errors of the center position of the electric component 28 in the horizontal plane, while the angular positioning error is an error of positioning of the electric component 28 about the axis of the suction nozzle 210.

The component-holding head 140 is then moved to the component hold-position rectifying position at which the head 140 is rotated by a suitable angle by the component hold-position rectifying device, so as to eliminate the obtained angular positioning error Δθ, and board-positioning data to position the printed-wiring board 38 for mounting the electric component 28 thereon are adjusted to compensate for the horizontal positioning errors ΔXE and ΔYE of the electric component 28 as held by the suction nozzle 210. The adjustment of the board-positioning data is also made at this time to compensate for a horizontal relative positioning error between the printed-wiring board 38 and the PWB supporting device 40. To this end, the positioning error of the board 38 positioned on the PWB supporting device 40 in the horizontal plane is calculated on the basis of images of the fiducial marks taken by the fiducial-mark camera 70. On the basis of the calculated horizontal positioning error of the board 38, horizontal positioning errors ΔXP and ΔYP of each component-mounting spot or position on the board 38 are calculated. X-axis movement data and Y-axis movement data of the board-positioning data used to position the printed-wiring board 38 in the XY plane are adjusted to compensate for the thus obtained horizontal positioning errors ΔXP and ΔYP of each component-mounting spot on the board 38, the horizontal positioning errors ΔAXE and ΔYE of the electric component 28 as held by the suction nozzle 210, and changes of the center position of the electric component 28 in the X-axis and Y-axis direction, which changes take place due to the compensation of the angular positioning error Δθ of the electric component 28. Then, the component-holding head 140 is moved to the component-mounting position at which the electric component 28 is transferred from the component-holding head 140 onto the corresponding mounting spot on the printed-wiring board 38.

The horizontal positioning errors ΔXP and ΔYP of the printed-wiring board 38 include positioning errors of the fiducial-mark camera 70 and positioning errors of the PWB positioning device 44 to position the printed-wiring board 38, in the plane parallel to the working surface 64 of the board 38. In other words, the horizontal positioning errors ΔXP and ΔYP are obtained on an assumption that there is not a relative positioning error between the fiducial-mark camera 70 and the printed-wiring board 38. In view of the relative positioning error of the fiducial-mark camera 70 and the board 38 and the positioning errors of the PWB positioning device 44, the board-positioning data are compensated for not only the positioning errors ΔXP and ΔYP of the board 38 but also the relative positioning error of the camera 70 and the board 38 and the positioning error of the PWB positioning device 44. Although there may be a positioning error of the component camera 296 with respect to the position of the suction nozzle 210, it is also assumed that the component camera 296 is accurately aligned with the suction nozzle 210. However, the positioning error of the component camera 296 may be detected, and the board-positioning data may be compensated for this positioning error, as well.

The component-holding head 140 located at the component-mounting position is vertically moved by the head lifting and lowering device 280, like the head 140 located at the component-receiving position. At the component-mounting position, the suction nozzle 210 is lowered to mount the electric component 28 onto the printed-wiring board 38, communicated with the atmosphere, and then lifted.

Then, the component-holding head 140 is moved to the angular-head-position resetting position at which the head 140 is rotated by Δθ in the direction opposite to the direction in which the head 140 was rotated at the component hold-position rectifying position, to the angular position before it was rotated at the component hold-position rectifying position. Then, the head 140 is moved to the angular-head-position 90°-reversing position at which the head 140 is rotated by 90° in the direction opposite to the direction in which the head 140 was rotated at the angular-component-position 90°-changing position. Thus, the head 140 is restored to its original angular position.

Then, the component-holding head 140 is moved to the component disposing position to discard the electric component 28 abnormally held by the suction nozzle 210, for example, the electric component 28 which was detected, at the component-upright-attitude detecting position, to have an upright attitude, or the electric component 28 which was detected, at the component hold-position detecting position, to have positioning errors that are too large to be eliminated at the component hold-position rectifying position.

The component-holding head 140 is then moved to the suction-nozzle detecting position at which the nozzle detecting device 254 detects the kind of the suction nozzle 210 presently placed in the operating position. The head 140 is then moved to the suction-nozzle selecting position at which the nozzle selecting device 224 is operated if the kind of the suction nozzle 210 presently placed in the operating position is different from that of the suction nozzle 210 to be used for the electric component 28 to be mounted next. Namely, the nozzle holder 202 is rotated to bring the appropriate suction nozzle 210 into the operating position.

The component-holding head 140 from which the electric component 28 has been transferred onto the printed-wiring board 38 is rotated by the angular-head-position resetting device and angular-head-position 90°-reversing device, to its original angular position, so that the detection and selection of the suction nozzle 210 at the respective suction-nozzle detecting and selecting positions and the suction of the electric component 28 by the suction nozzle 210 at the component-receiving position are effected while the component-holding head 140 are placed in the original angular position in which the axis of rotation of the nozzle holder 202 extends in the radial direction of the indexing body 126, so that the nozzle detecting device 254 can detect the kind of the suction nozzle 210 placed in the operating position, and the nozzle holder 202 can be rotated by the rotary drive rod 226 of the nozzle selecting device 224, with the engaging teeth 236 held in engagement with the engaging grooves 234.

The 16 component-holding heads 140 are intermittently turned with the intermittent rotary motion of the indexing body 126, to successively hold the electric components 28 received from the tape feeder 26, and mount the electric components 28 onto the printed-wiring board 38, while the cam 112 is kept rotated by the intermittent rotary drive motor 114. By controlling the operating speed of the rotary drive motor 114 to control the rotating speed of the cam 112, it is possible to change the pattern of control of the operating speed of the head turning device 142, more specifically, to control the acceleration and deceleration values and the maximal value of the turning speed of each component-holding head 140, and to control the time required for moving the head 140 between the adjacent working positions and the length of time (stopping time) for which the head 140 is held stopped at each working position. The acceleration and deceleration values, maximal turning speed and stopping time of the head 140 are determined by the configuration and operating speed of the cam 112. As the rotating speed of the cam 112 is increased, the acceleration and deceleration values and maximal speed of the head 140 are increased, while the required time (required movement time) for moving the head 140 between the adjacent working positions and the stopping time are reduced. Where the rotating speed of the cam 112 is held constant throughout the full rotation of the cam 112, the required movement time is reduced with an increase in the acceleration and deceleration values and maximum speed of the head 140, and the stopping time is reduced as the required movement time is reduced. However, the required movement time and the stopping time can be controlled as desired independently of each other, by controlling the rotating speed of the cam 112 such that the rotating speed during the turning movement of the head 140 is different from that during stopping of the head 140 at each working position. In view of this fact, the present embodiment is arranged to control the pattern of control of the turning speed of each component-holding head 140, by suitably controlling both of the moving and stopping times of the head 140, that is, by controlling both of the rotating speeds of the cam 112 iliduring the turning movement and the stopping of the head 140.

The moving time of the head 140 is determined by various factors such as the size of the electric component 28 to be mounted on the board 38. Where the electric component 28 has a relatively large height dimension and/or a relatively large mass, the electric component 28 may be dislocated with respect to the suction nozzle 210 or may fall from the suction nozzle 210 when the head 140 is moved at a relatively high speed. In this case, it is required to reduce the acceleration and deceleration values of the head 140 and increase the moving time of the head 140. Where the electric components 28 already mounted on the printed-wiring board 38 have a relatively large height dimension and/or a relatively large mass, the electric components 28 may be dislocated with respect to the board 38 or turned on the board 38 when the board 38 is moved at high acceleration and deceleration values. In this case, it is required to reduce the acceleration and deceleration values of the board 38 and increase the moving time of the board 38. Since the turning movement of the head 140 to the component-mounting position is synchronized with the positioning of the board 38, the moving time of the head 140 may be required to be increased to increase the moving time of the board 38. In this respect, it is noted that the required distance of movement of the board 38 is usually small, the movement of the board 38 is usually effected at relatively low acceleration and deceleration values. Generally, the electric components 28 which have comparatively small sizes and/or masses and which are comparatively less likely to be dislocated with respect to the board 38 or turned on the board 38 are mounted on the board 38 before the electric components 28 having comparatively large sizes and/or masses. Accordingly, the acceleration and deceleration values of the head 140 are reduced and the moving time of the head 140 is increased as the size of the electric component 28 to be mounted on the board 38 is increased, that is, as the acceleration and deceleration values of the board 38 are reduced to increase the moving time of the board 38. Therefore, the moving time of the head 140 is not usually determined by the moving time of the board 38, but is determined by the size and mass of the electric component 28 held by the head 140. Where the distance of movement of the board 38 is comparatively large and the required moving time of the board 38 is relatively long, it may be required to increase the moving time of the head 140 for synchronization of the movement of the head 140 to the component-mounting position with the movement of the board 38.

The required stopping time of the head 140 is determined by the angle of rotation of the nozzle holder 202 to bring the next selected suction nozzle 210 into its operating position. As described above, each of the 16 component-mounting units 237 has a total of six suction nozzles 210 which are selectively placed in the operating position for holding the electric components 28 of the respective different kinds. To bring a selected one of the six suction nozzles 210 into its operating position, the nozzle holder 202 is rotated clockwise or counterclockwise by 60°, 120° or 180°, that is, by a maximum angle of 180°. The required stopping time of the component-holding head 140 increases with an increase in the required angle of rotation of the nozzle holder 202 to bring the selected suction nozzle 210 into its operating position.

The moving time and stopping time of the component-holding head 140 may be controlled in various manners. For instance, the rotating speed of the cam 112 is changed in three steps, namely, controlled to be one of 100%, 80% and 60% of the maximum speed, depending upon the kind of the electric component 28. For example, where the size of the electric component 28 is small enough to permit the head 140 to be moved at comparatively high acceleration and deceleration values without a risk of falling or dislocation of the electric component 28 from or with respect to the head 140 the rotating speed of the cam 112 during the turning movement of the head 140 is controlled to the maximum value. Where the size of the electric component 28 is too large to permit the head 140 to be moved at comparatively high acceleration and deceleration values, the rotating speed of the cam 112 during the turning movement of the head 140 is controlled to be 80% or 60% of the maximum value.

Where the nozzle holder 202 is required to be rotated by 180° to bring the selected suction nozzle 210 into its operating position, the rotating speed of the cam 112 during stopping of the component-holding head 140 may be controlled to be 60% of the maximum value. Where the nozzle holder 202 is required to be rotated by 120° or 60° to bring the selected suction nozzle 210 into its operating operation, the rotating speed of the cam 112 may be controlled to be 80% of the maximum value. Where the nozzle holder 202 is not rotated, that is, where the suction nozzle 210 used to hold the electric component 28 is not changed, the cam 112 is rotated at its maximum speed during stopping of the headA 140. The rotating speed of the cam 112 during stopping of the head 140 may be controlled to be the maximum value where the nozzle holder 202 is rotated by 60°, and to be 60% of the maximum speed where the nozzle holder 202 is rotated by 120°. The cam 112 may be rotated at its maximum speed while the component-head 140 is stopped at the component hold-position rectifying position at which the head 140 is rotated for compensation of the angular positioning error Δθ of the electric component 28.

The pattern of control of the moving speed of each component-holding head 140 is defined by a combination of (a) a selected one of the three rotating speed values (100%, 80% and 60%) of the cam 112 during movement of the head 140, and (b) a selected one of the three rotating speed values of the cam 112 during stopping of the head 140. In this respect, the operating or rotating speed of the cam 112 may be considered to be controlled in a selected one of different patterns. The cam 112 is a part of the first relative-movement device operable to move the component-holding head 140 and the printed-wiring board 38 in the horizontal direction. The pattern of control of the moving speed of the heads 140 is changed during a series of operations to mount the electric components 28 on one printed-wiring board 38, since the suction nozzles 210 of different kinds are used to mount the electric components 28 of different kinds on the board 38. Where the electric components 28 to be mounted on the board 38 have different height dimensions and/or different masses, and are mounted on the board 38 in the order of the size such that the comparatively small components 28 are mounted before the comparatively large components 28, the component-holding heads 140 holding the comparatively small electric components 28 are moved at relatively high acceleration and deceleration values, with a relatively high rotating speed of the cam 112, while the heads 140 holding the comparatively large components 28 are moved relatively low acceleration and deceleration values, with a relatively low rotating speed of the cam 112. Further, the rotating speed of the cam 112 during stopping of the head 140 is changed depending upon the required angle of rotation of the nozzle holder 202 to bring the selected suction nozzle 210 into its operating position. The kind of the electric components 28 held by the 16 component-holding heads 140 and the required angle of rotation of the nozzle holder 202 may change during one full rotation of the indexing body 126. Therefore, the desired rotating speed of the cam 112 during movement of a certain head 140 may be different from that during movement of another head 140, or the desired rotating speed of the cam 112 during stopping of a certain head 140 may be different from that during stopping of another head 140. In this case, the cam 112 is rotated at a lower one of the two desired rotating speeds during movement and/or stopping of the heads 140.

As described before by reference to the time chart of FIG. 8, the engaging member 182 of the rotation transmitting shaft 172 of each component-holding head 140 reaches each working position before the head 140, by rotation of the externally toothed ring gear 186. The angular velocity of the ring gear 186 is controlled according to the rotating speed of the cam 112 such that the angular velocity of the ring gear 186 is two times that of the indexing body 126, so as to establish the above-indicted non-relative-movement state depending upon the rotating speed of the cam 112. In the non-relative-movement state, the engaging member 182 is not moved in the rotating direction of the indexing body 126, relative to the engaging member of the working device such as the angular-component-position 90°-changing device at the angular-component-position 90°-changing position. Further, the moving time of each component-holding head 140 may be made longer or shorter than the nominal value of 60 ms, depending upon the rotating speed of the cam 112. Similarly, the stopping time of the head 140 may be made longer or shorter, depending upon the rotating speed of the cam 112. The intermittent rotary drive motor 114 provided to rotate the indexing body 126 is used for engagement and releasing of the engaging member 182 with and from the engaging member of some of the working devices such as the angular-component-position 90°-changing device. Accordingly, the time required for engagement and releasing of the engaging member 182 is determined by the rotating speed of the cam 112. On the other hand, exclusive drive motors are used for engagement and releasing of the engaging member 182 with and from the engaging member of the component hold-position rectifying device for rotating the electric component 28 and the angular-head-position resetting device for rotating the head 140. Accordingly, the rotating speeds of these exclusive drive motors are changed depending upon the rotating speed of the cam 112 such that the rotating speeds of the motors are increased as the rotating speed of the cam 112 is increased. If sufficient times are available for the component hold-position rectifying device to rotate the electric component 28 for compensation for the angular positioning error, and for the angular-head-position resetting device to rotate the head 140 at the resetting position, even if the moving time and/or the stopping time is/are shortened with an increase of the rotating speed of the cam 112, it is not essential to change the rotating speeds of the exclusive motors provided for the component hold-position rectifying device and angular-head-position resetting device.

The rotating speed of the cam 112 during movement of each component-holding head 140 is stored in the RAM 306 of the computer 310, in relation to the kind of the electric component 28 to be mounted on the printed-wiring board 38. When the electric component 28 is mounted on the printed-wiring board 38 according to the component-mounting programs, the rotating speed of the cam 112 corresponding to the specific kind of the electric component 28 is read out from the RAM 306, to rotate the cam 112 at this rotating speed. Further, the rotating speed of the cam 112 is stored in the RAM 306, in relation to the required angle of rotation of the nozzle holder 202 to select each of the suction nozzles 210. When the desired suction nozzle 210 is brought into its operating position, the rotating speed of the cam 112 corresponding to the required angle of rotation of the nozzle holder 202 to bring this suction nozzle 210 into its operating position is read out from the RAM 306, to rotate the cam 112 at this rotating speed.

The pattern of control of the moving speed of the head 140 is determined and controlled as described above. However, there may be a relative positioning error between the position of the suction nozzle 210 and the component-mounting spot or position on the printed-wiring board 38, for each electric component 28 to be mounted on the board 38 by the head 140. In the present electric-component mounting system, the component-holding heads 140 are turned at a comparatively high speed by the head turning device 142, while the printed-wiring board 38 is moved at a comparatively low speed by the PWB positioning device 44. Accordingly, the relative positioning error between the suction nozzle 210 and the board 38 is caused primarily by elastic deformation of the head 140 and the head turning device 142, at a moment when the electric component 28 is mounted on the board 38 immediately after the termination of the turning movement of the head 140 by the head turning device 142.

Figure 9:
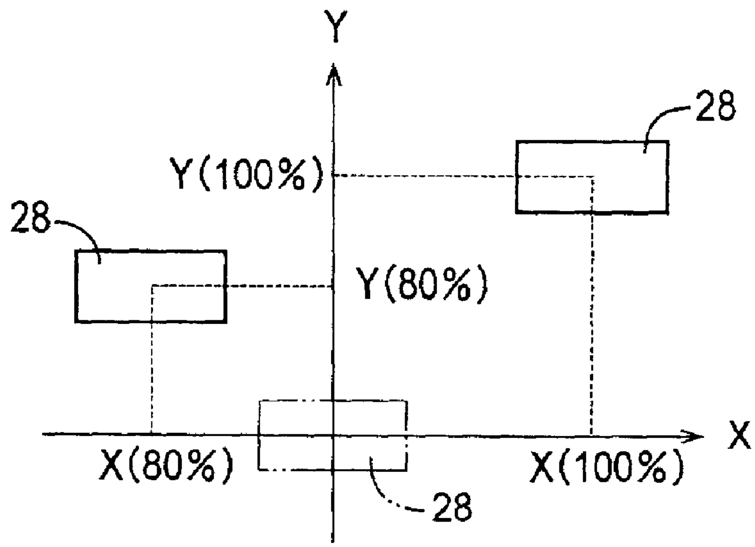
FIG. 9 is a view for explaining positioning errors of an electric component mounted on a printed-wiring board by the component-holding head, with respect to a nominal mounting position.

The amount and direction of the positioning error of the electric component 28 (suction nozzle 210) with respect to the nominal mounting position on the board 38 vary, as indicated in FIG. 9, depending upon the acceleration and deceleration values of the component-holding head 140 and the maximal speed of the indexing body 126, that is, depending upon the rotating speed of the cam 112. Two-dot chain line in FIG. 9 indicates the nominal mounting position of the electric component 28 on the board 38. The amount and direction of the positioning error of the component 28 when the cam 112 is rotated at 80% of its maximum speed are both different from those when the cam 112 is rotated at its maximum speed (100% speed).

Figure 10:
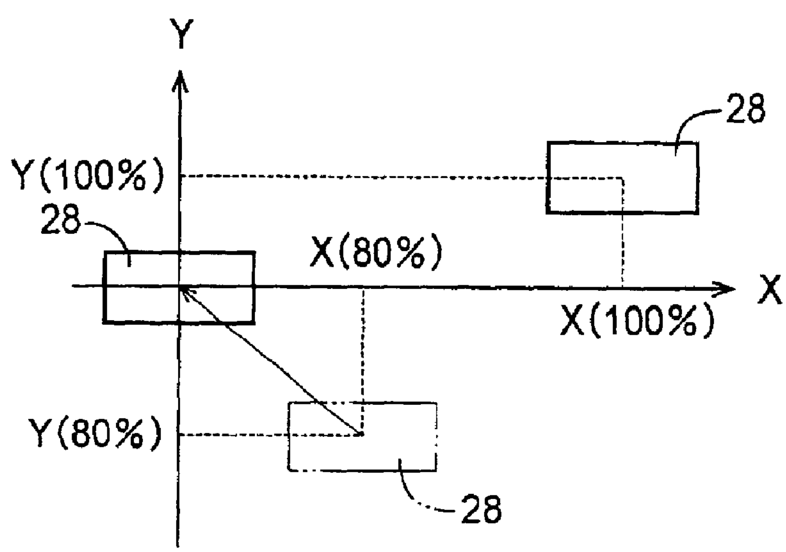
FIG. 10 is a view for explaining a positioning error of the electric component mounted on the board where the component-holding head is moved at a speed different from that in the case of FIG. 9.

To eliminate this positioning error of the electric component 28 or suction nozzle 210, the position to which the printed-wiring board 38 is moved by the PWB positioning device 44 is adjusted. Normally or theoretically, the printed-wiring board 38 is moved to a position at which the nominal mounting position of the electric component 28 is right below the suction nozzle 210, and the board 38 is moved to this position by the PWB positioning device 44 when each electric component 28 is mounted on the board 38. In this case, there arises a relative positioning error between the suction nozzle 210 (component 28) and each component-mounting position on the board 38, for the reason described above. If the position to which the board 38 is moved is adjusted to prevent the positioning error when the cam 112 is rotated at 80% of the maximum speed, there arises the positioning error when the cam 112 is rotated at the maximum speed, and moreover, the amount of the positioning error of the component 28 is increased, as indicated in FIG. 10. Similarly, the amount of the positioning error when the cam 112 is rotated at 80% of the maximum speed is increased where the position to which the board 38 is moved is adjusted to prevent the positioning error when the cam 112 is rotated at the maximum speed. In the present embodiment, the amount and direction of the positioning error of the electric component 28 to be mounted on the board 38 are obtained at the different rotating speeds of the cam 112, before the component 28 is mounted on the board 38.

The suction nozzles 210 placed in the operating position on the respective nozzle holders 202 of all of the component-holding heads 140 are located at the same position when the corresponding heads 140 reach the component-mounting position with an intermittent rotary motion of the indexing body 126, so that the operations to mount the electric components 28 on the board 38 are performed with the suction nozzles 210 located at the same position. Accordingly, the amount and direction of the positioning error of the electric components 28 mounted on the board 38 are the same for all of the suction nozzles 210 (all of the heads 140), provided that the suction nozzles 210 are of the same kind and that the cam 112 is rotated at the same speed, irrespective of the specific kind and mounting position of the electric components 28. In view of this, the amount and direction of the positioning error of the electric component 28 are obtained for each of the different kinds of the suction nozzles 210, at different rotating speeds of the cam 112.

In the present embodiment, two sets of the amount and direction of the positioning error are obtained for each suction nozzel 210, for the respective 100% and 80% of the maximum rotating speed of the cam 112. As described above, the amount and direction of the positioning error when the cam 112 is rotated at its maximum 100% speed are considerably different from those when the cam 112 is rotated at 80% of the maximum speed. However the amount and direction of the positioning error when the cam 112 is rotated at a speed lower than 80% of the maximum speed are almost similar to those when the cam is rotated at the 80% speed.

Figure 11:
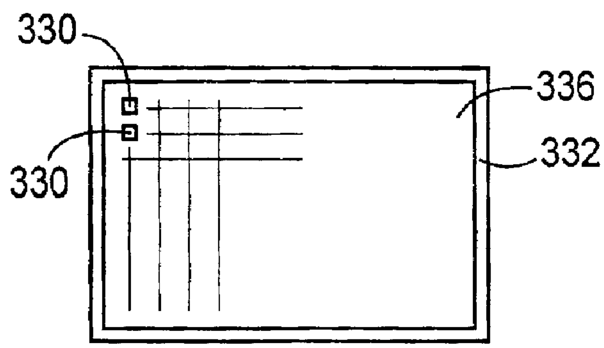
FIG. 11 is a plan view schematically showing test chips and a test substrate which are used to detect the positioning errors of the electric component.

In the present embodiment, the amount and direction of the positioning error are detected by using test chips 330 and a test substrate 332, as schematically illustrated in FIG. 11. The test chips 330 are supplied from an exclusive test-chip feeder 334 disposed on the feeder support table 24, as shown in FIG. 1. Like the tape feeders 26 for the electric components 28, the test-chip feeder 334 includes a test-chip feeding device adapted to feed a carrier tape accommodating a multiplicity of test chips 330 so that the test chips 330 are successively supplied one after another to a chip-supply portion. Like the carrier tape accommodating the electric components 28, the carrier tape accommodating the test chips 330 includes a carrier substrate which has a multiplicity of chip-accommodating recesses for accommodating the respective the test chips. The recesses are closed by a covering film to prevent removal of the test chips 330 during the feeding of the carrier tape. The test-chip feeder 334 is removably mounted on the feeder support table 24, for instance, at one end of the feeder support table 24, such that the chip-supply portion of the test-chip feeder 334 lies on the straight line along which the component-supply portions of the tape feeders 26 are arranged. When the positioning error is detected, the feeder support table 24 is moved to position the test-chip feeder 334 such that the chip-supply portion is located at the component-supply position at which the test chips 330 are picked up by the component-holding beads 140, in the same manner as the electric components 28 supplied from the tape feeders 26. holding heads 140, in the same manner as the electric component 28 supplied from the tape feeders 26.

Like the printed-wiring board 38, the test substrate 332 is supported by the PWB supporting device 40 and positioned by the PWB positioning device 44. A double-coated adhesive tape 336 is bonded to the upper surface of the test substrate 332, so that the test chips 330 mounted on the test substrate 332 are not dislocated when the test substrate 332 is moved. The double-coated adhesive tape 336 serves as chip-dislocation preventing means for preventing dislocation of the test chips 330 on the test substrate 332, or chip fixing means for fixing the test chips 330 on the test substrate 332. In the present embodiment, the test chips 330 are mounted at respective positions which are arranged at grid points of a lattice. The test chips 330 supplied from the test-chip feeder 334 are picked up by the component-holding heads 140 one after another, and mounted at the respective positions on the test substrate 332, in a predetermined order, from the leftmost row toward the rightmost row of the lattice, as seen in FIG. 11, in this embodiment.

There will be described the manner of detecting the direction and amount of the positioning error of the test chips 330 as mounted on the test substrate 332. Initially, a selected one of the six suction nozzles 210 is brought into its operating position on each of the 16 component-holding heads 140 of the 16 component-holding units 237. Then, the heads 140 are intermittently turned with the cam 112 rotated at 100% of its maximum speed. During this intermittent turning movements of the heads 140, each head 140 stopped at the component-receiving position is operated to receive the test chip 330 from the test-chip feeder 334, while each head 140 stopped at the component-mounting position is operated to mount the test chip 330 at the predetermined position on the test substrate 332. The cam 112 is kept rotated at the same speed (maximum speed) during the turning movement of the head 140 as well as during the stopping of the head 140 at each working position. The test substrate 332 is positioned by the PWB positioning device 44 so that the predetermined mounting positions of the test chips 330 are aligned with the suction nozzle 210 placed at the component-mounting position, in the predetermined order as described above. After the test chips 330 have been mounted with the cam 112 rotated at its maximum speed, the test chips 330 are mounted with the cam 112 rotated at 80% of the maximum speed.

After the test chips 330 have been mounted on the test substrate 332, by all of the 16 component-holding heads 140, at the 100% and 80% values of the maximum speed of the cam 112, the next suction nozzle 210 is brought into its operating position on each of the 16 heads 140, and the test chips 330 are mounted with the cam 112 rotated at the 100% and 80% values of the maximum speed. That is, the nozzle holder 202 of the head 140 from which the test chip 330 has been transferred onto the test substrate 332 is rotated to bring the next suction nozzle 210 into the operating position, when the head 140 reaches the suction-nozzle selecting position.

The operation to mount the test chips 330 on the test substrate 332 using the first suction nozzle 210 and at the 80% rotating speed of the cam 112 is terminated for all of the 16 component-holding head 140, before the suction nozzles 210 of all the heads 140 have been changed to the second suction nozzles 210. That is, when the test chip 330 is transferred to the test substrate 332 from the first suction nozzle 210 of the last or sixteenth head 140 which is moved with the cam 112 rotated at the 80% speed, the first suction nozzles 210 of the five heads 140 stopped at the working stations between the suction-nozzle selecting position and the component-mounting position remain in their operating position, that is, have not yet been changed to the second suction nozzles 210. To change these first suction nozzles 210 to the second suction nozzles 210, the nozzle holders 202 are required to be rotated by 60°. Therefore, this operation to change the first suction nozzles 210 to the second suction nozzles 210 is required to be performed while the cam 112 is rotated at the 80% speed. Accordingly, the heads 140 are turned with the cam 112 rotated at the 80% speed until the first suction nozzles 210 of the above-indicated five heads 140 are changed to the second suction nozzles 210 at the suction-nozzle selecting position. During this turning movement of the heads 140, the test chips 330 are picked up by the heads 140 reaching the component-receiving position, but the test chips 330 are not transferred to the test substrate 332 from the second suction nozzles 210 of the heads at the component-mounting position, since the mounting of the test chips 330 from the second suction nozzles 210 must be performed initially with the cam 112 rotated at the 100% speed. After the second suction nozzles 210 are placed in the operating position on all of the heads 140, the cam 112 is rotated at the 100% speed, and the mounting of the test chips 330 onto the test substrate 332 is initiated. Hence, the head 140 at which the operation to transfer the test chips 330 from the second suction nozzles 210 onto the test substrate 332 is initiated is different from the head at which the operation to transfer the test chips 330 from the first suction nozzles 210 onto the test substrate 332 is initiated. This is true for the second and third suction nozzles 210, and the other adjacent suction nozzles 210.

However, where the time required to rotate the nozzle holder 202 by 60° is short enough to permit the nozzle holder 202 to be rotated to bring the next suction nozzle 210 into the operating state even at the 100% rotating speed of the cam 112, the mounting of the test chips 330 onto the test substrate 332 may be performed concurrently with the operation to change the suction nozzles 210, while the cam 112 is rotated at the 100% speed. Alternatively, the indexing body 126 may be rotated one full turn for the sole purpose of changing the suction nozzles 210 of all the heads 140 to the next suction nozzles 210. In this case, the operation to mount the test chips 330 is performed during the next one full rotation of the indexing body 126.

Thus, the test chips 330 are mounted on the test substrate 332 using all of the six suction nozzles 210 and at the two different rotating speeds (100% and 80% of the maximum speed) of the cam 112. This series of operation is repeated a suitable number (N) of times, for example, three times. In this case, a total of six test chips 330 are mounted on the test substrate 332, for each suction nozzle 210, namely, three test chips 330 for each of the two different rotating speeds of the cam 112. The operation to mount the test chips 330 onto the test substrate 332, the operation to change the suction nozzles 210, the operation to control the rotating speed of the cam 112, and the operation to position the test substrate 332 to align the predetermined chip-mounting positions with the component-mounting position in the electric-component mounting system, are performed according to chip-mounting programs and substrate-positioning data (movement data for the test substrate 332) which are stored in the RAM 306. The substrate-positioning data are data used to control the PWB positioning device 44 for moving the PWB supporting device 40 to position the test substrate 332 such that the chip-mounting positions on the test substrate 332 are sequentially brought to the component-mounting position in the electric-component mounting system. In the present embodiment, the substrate-positioning data represent X-axis and Y-axis coordinate values with respect to an absolute zero point in the XY coordinate system, that is, in the horizontal XY plane. Thus, the substrate-positioning data are similar to the board-positioning data for positioning the PWB supporting device 40 to position the printed-wiring board 38 when the electric components 28 are mounted on the board 38. In the present embodiment, the absolute zero point is located such that the X-axis and Y-axis coordinate values of the substrate-positioning data and the board-positioning data are positive values.

After the test chips 330 have been mounted on the test substrate 332 with all of the suction nozzles 210 and at the two different rotating speeds of the cam 112, images of the test chips 330 are taken by the fiducial-mark camera 70. The test substrate 332 is moved by the PWB positioning device 44, to bring each of the test chips 330 mounted on the substrate 332, to an imaging position at which the image of the test chip 330 is taken by the fiducial-mark camera 70. The movement of the test substrate 332 may be controlled according to the substrate-positioning data and a positional relationship between the component-mounting position and the imaging position. Alternatively, the movement may be controlled according to movement data prepared to move each chip-mounting position on the substrate 332 to the imaging position.

After all of the test chips 330 have been imaged, image data representative of the images of the test chips 330 are processed to obtain the amount and direction of a positioning error of each test chip 330. If the test chip 330 is mounted at the nominal chip-mounting position without a positioning error, the image of this test chip 330 is formed at a predetermined position (e.g., at the center) of an imaging area of the fiducial-mark camera 70, as indicated by two-dot chain line in FIG. 12. If the test chip 330 is dislocated with respect to the nominal chip-mounting position, the image of the test chip 330 is offset from the predetermined position, as indicated in solid line in FIG. 12. In this figure, reference numeral 330 denotes the image of the test chip 330.

Figure 12:
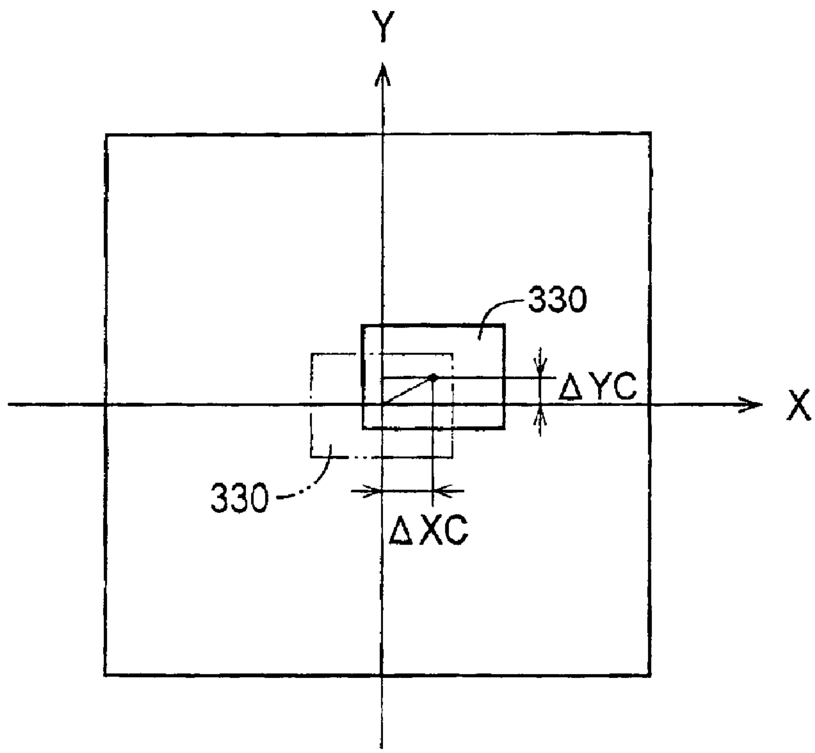
FIG. 12 is a view showing an image of the test chip formed in an imaging area of a camera.

In the example of FIG. 12, the image data are processed to obtain an estimated X-axis positioning error ΔXC and an estimated Y-axis positioning error ΔYC of each component-mounting position on the printed-wiring board 38, which are positioning error amounts of the test chip 330 measured in the respective X-axis and Y-axis directions. The X-axis and Y-axis positioning errors ΔXC and ΔYC, which represent the amount and direction of the positioning error of the test chip 330, are averages of the three error values obtained for each suction nozzle 210 at one of the two different rotating speeds of the cam 112. Sets of the estimated X-axis and Y-axis positioning errors ΔXC and ΔYC are stored in a memory area provided in the RAM 306, in relation to the component-holding head 140, the suction nozzle 210 and the rotating speed of the cam 112, as indicated in FIG. 13. In the present embodiment, the suction nozzles 210 of all of the heads 140 are identified by a combination of a head-identification code indicative of each head 140 and a nozzle-identification code indicative of each suction nozzle 210 of the nozzle holder 202. This combination of the codes will be hereinafter referred to as a "suction-nozzle code" identifying each suction nozzle 210. However, the suction nozzles 210 of all of the heads 140 may be given respective suction-nozzle codes.

When the electric components 28 are mounted on the printed-wiring board 38, the board-positioning data are adjusted for compensation for the horizontal positioning errors ΔXE and ΔYE of the electric component 28 as held by the suction nozzle 210, the positioning errors ΔXP and ΔYP of each component-mounting position on the board 38, and changes of the center position of the electric component 28 in the X-axis and Y-axis direction, which changes take place due to the compensation of the angular positioning error Δθ of the electric component 28. Further, the board-positioning data are further adjusted for compensation for the estimated X-axis and Y-axis positioning errors ΔXC and ΔYC of each component-mounting position or spot on the board 38, which have been obtained by experimentation and which vary depending upon the turning speed of the component-holding head 140 and the kind of the suction nozzle 210 used.

As described above, the estimated positioning errors ΔXC and ΔYC which vary depending upon the turning speed of the component-holding head 140 and the kind of the suction nozzle 210 have been obtained for each of the suction nozzles 210 and for each of the 100% and 80% values of the maximum speed of the cam 112. One of the thus obtained sets of estimated positioning errors ΔXC and ΔYC is selected on the basis of a specific combination of the rotating speed of the cam 112 during the turning movement of the head 140 and the rotating speed of the cam 112 during the stopping of the head 140 at each working position, that is, on the basis of the specific pattern of control of the rotating speed of the cam 112 established during operations to mount the electric components 28 on the board 38. The table of FIG. 14 indicates possible combinations of the rotating speeds of the cam 112, and the set of estimated positioning errors ΔXC and ΔYC, which set is selected in the present embodiment, to adjust the board-positioning data. As is apparent from this table, the estimated positioning errors ΔXC and ΔYC obtained when the cam 112 was rotated at its maximum speed (100% speed) are used only where the cam 112 is rotated at the 100% speed during both of the turning movement and stopping of the component-holding head 140. A considered reason for this will be described.

The estimated positioning errors ΔXC and ΔYC were obtained by rotating the cam 112 at the same speed during the turning movement and stopping of the head 140. The actual positioning errors of the electric component 28 when the rotating speed of the cam 112 is held constant during the turning movement and stopping of the head 140 is considered to be the same as the estimated positioning errors ΔXC and ΔYC which were obtained at the same rotating speed of the cam 112. In this respect, it is reasonable to use the positioning errors ΔXC and ΔYC obtained at the rotating speed of the cam 112 which is the same as in the actual component-mounting operation. More specifically described, it is reasonable to use the positioning errors ΔXC and ΔYC obtained at the 80% speed of the cam 112, where the actual component-mounting operation is performed at the 80% speed during both of the turning movement and stopping of the component-holding head 140, and use the positioning errors ΔXC and ΔYC obtained at the 100% speed of the cam 112, where the actual component-mounting operation is performed at the 100% speed during both of the turning movement and stopping of the head 140.

Where the moving time of the head 140 is relatively short with the cam 112 rotated at a relatively high speed to turn the head 140, while the stopping time of the head 140 is relatively long with the cam 112 rotated at a relatively low speed during the stopping of the head 140, on the other hand, a relatively large magnitude of vibration is generated upon stopping of the head 140 at each working position, but this vibration can be sufficiently attenuated upon mounting of the electric component 28 on the printed-wiring board 38.

Therefore, it is considered appropriate to use the estimated positioning errors ΔXC and ΔYC obtained when the cam 112 was rotated at the 80% speed.

Where the cam 112 is rotated at a low speed during the turning movement of the head 140 and at a relatively high speed during the stopping of the head 140, a relatively small magnitude of vibration is generated upon stopping of the head 140 at each working position, and the vibration does not significantly influence the actual positioning error of the electric component 28, in spite of the relatively short stopping time of the head 140. Therefore, it is considered appropriate to use the estimated positioning errors ΔXC and ΔYC obtained when the cam 112 was rotated at the 80% speed.

The board-position data to move the PWB supporting device 40 to position the printed-wiring board 38 are adjusted in the present embodiment, in the following manner. The board-positioning data are X-axis and Y-axis coordinate values representative of the positions of the PWB supporting device 40 at which the component-mounting spots on the printed-wiring board 38 are located right below the component-mounting position at which the component-holding heads 140 perform the operations to mount the electric components 28 on the board 38. Further, the RAM 306 stores the sets of estimated positioning errors ΔXC and ΔYC, in relation to the suction-nozzle codes identifying the suction nozzles 210, and the rotating speeds of the cam 112 used to obtain the estimated positioning errors ΔXC and ΔYC, as shown in FIG. 13

The appropriate one of the sets of estimated positioning errors ΔXC and ΔYC is read out from the RAM 306, on the basis of the suction-nozzle code of the suction nozzle 210 in question and the actual rotating speed of the cam 112, for each of the component-mounting positions on the printed-wiring board 38. The board-positioning data are adjusted by adding the read-out positioning errors ΔXC and ΔYC to the X-axis and Y-axis coordinate values of the component-mounting position in question. The position of the board 38 represented by the thus adjusted board-positioning data of each component-mounting positions will be referred to as a "control-target position". The control-target position for each of the multiplicity of component-mounting positions is determined on the basis of the appropriate set of estimated positioning errors which is selected from among the two or more sets stored in the RAM 306, depending upon the specific pattern of control of the actual rotating speed of the cam 112, that is, the specific combination of the actual rotating speeds of the cam 112 during the turning movement and the stopping of the head 140. The movement of the PWB supporting device 40 to move the printed-wiring board 38 is controlled according to the thus determined control-target position, for thereby eliminating the actual positioning error of the component-mounting position on the board 38. As described below, the board-positioning data are adjusted for compensation for the estimating positioning errors ΔXC and ΔYC of each component-mounting position on the board 38, as well as for the horizontal positioning errors ΔXE and ΔYE of the electric component 28 as held by the suction nozzle 210.

The estimated positioning errors ΔXC and ΔYC include the positioning error of the fiducial-mark camera 70 and the positioning error of the printed-wiring board 38 as positioned by the PWB positioning device 44. Namely, like the horizontal positioning errors ΔXP and ΔYP of each component-mounting position (suction nozzle 210), the positioning errors ΔXC and ΔYC are obtained on an assumption that the printed-wiring board 38 and the fiducial-mark camera 70 do not have a relative positioning error. That is, the horizontal positioning errors ΔXP and ΔYP are obtained on the basis of the image of the fiducial mark on the board 38, which is taken by the fiducial-mark camera 70, on an assumption that the camera 70 and the board 38 do not have a relative positioning error. Similarly, the positioning errors ΔXC and ΔYC are obtained on the basis of the images of the test chips 330 which are taken by the fiducial-mark camera 70 by moving the test substrate 332 to bring each component-mounting position to the imaging position of the camera 70, on an assumption that the camera 70 and the test substrate 332 do not have a relative positioning error. For improved mounting accuracy of the electric components 28 on the printed-wiring board 38, the board-positioning data are compensated for not only the obtained horizontal relative positioning errors ΔXP, ΔYP between the board 38 and the PWB supporting device 40 and the estimated relative positioning errors ΔXC, ΔYC between the suction nozzle 210 and each component-mounting position on the board 38, but also the relative positioning error between the fiducial-mark camera 70 and the board 38 and the positioning error of the board 38 as positioned by the PWB positioning device 44.

The actual positioning errors of each component-holding head 140, which are caused primarily by elastic deformation of the head 140 and the head turning device 142 upon stopping of the head 140, take place when the head 140 is stopped at each of the 16 working positions or stations, that is, take place at the component hold-position detecting position, as well. However, the image of the electric component 28 held by the suction nozzle 210 of the head 140 at the component hold-position detecting position is taken by the component camera 296 after a vibration of the suction nozzle 210 due to the above-indicated elastic deformation has been attenuated and the suction nozzle 210 has come to a standstill. Accordingly, the obtained horizontal positioning errors ΔXE, ΔYE do not include a positioning error of the electric component 28 due to the vibration of the suction nozzle 210. On the other hand, the estimated positioning errors ΔXC, ΔYC of the suction nozzle 210 (each component-mounting position on the board 38) due to the elastic deformation of the head 140 and the head turning device 142 are obtained by experimentation at the component-mounting position, using the test chips 330 and the test substrate 332, as described above.

In the present embodiment, the position of each component-holding head 140 and the position of the PWB supporting device 40 are defined with respect to the component-mounting position, and the estimated positioning errors ΔXC, ΔYC representing the amount and direction of the positioning error of the suction nozzle 210 are used as a control target, which is stored in the RAM 306, as a difference between the control-target position and the component-mounting position. The control target for each suction nozzle 210 of each head 140 is stored in relation to the specific pattern of control of the moving speed of the head 140 when the positioning errors ΔXE, ΔYE are obtained, more specifically, in relation to the suction-nozzle code identifying each suction nozzle 210 and the rotating speed of the cam 112 when the positioning errors are obtained. The control target for each suction nozzle 210 is determined on the basis of the suction-nozzle code and the rotating speed of the cam 112. The control target for each suction nozzle 210 is obtained for each of two different rotating speeds of the cam 112. In other words, the control target used to position the component-holding head 140 and the PWB supporting device 40 (board 38) relative to each other for mounting the electric component 28 using a given suction nozzle 210 is provided for each of two different patterns of control of the moving speed of the head 140, which are defined by respective two different combinations of the rotating speeds of the cam 112 during the movement and stopping of the head 140. The stopping time of the head 140 can be changed by changing the rotating speed of the cam 112 during the stopping of the head 140, while the acceleration and deceleration values and the maximal speed of the head 140 (indexing body 126) can be changed by changing the rotating speed of the cam 112 during the movement of the head 140. Thus, the plurality of control targets are selectively used depending upon the stopping time of the head 140 and the acceleration and deceleration values of the head 140.

In the present embodiment, the prepared board-positioning data to position the board 38 are adjusted for compensation for the positioning errors ΔXC, ΔYC of each suction nozzle 210 (for each electric component 28 or each component-mounting position on the board 38) which are determined depending upon the rotating speeds of the cam 112 during the turning movement and stopping of the corresponding component-holding head 140, so that the electric component 28 can be mounted on the printed-wiring board 38 with a reduced positioning error with respect to the nominal component-mounting position, or without a positioning error, even where the acceleration and deceleration values and maximal moving speed of the head 140 are increased or reduced. This arrangement does not require an increase of the rigidity of the component-holding heads 140 and the head turning device 142, for reducing the positioning errors of the suction nozzles 210 upon stopping of the heads 140 where the heads 140 are moved at relatively high acceleration and deceleration values. Accordingly, the instant arrangement assures accurate, economical and efficient mounting of the electric components 28 on the board 38.

The board-positioning data for all of the component-mounting positions or spots on the printed-wiring board 38 may be adjusted prior to the mounting operations of all of the electric components 28 on the board 38, rather than during the mounting operation of each component 28, for compensation for the horizontal relative positioning errors ΔXP, ΔYP between the board 38 and the PWB supporting device 40, and/or the positioning errors ΔXC, ΔYC of the suction nozzles 210 upon stopping of the heads 140 at the component-mounting position.

The control device 300 includes a positioning portion, and a control-target determining portion which includes speed-control-pattern changing means, test-chip mounting control means, data processing means, and control-target determining means. It will be understood from the foregoing description of the present embodiment that the positioning portion is a portion of the control device 300 assigned to obtain the amount and direction of the positioning error of each suction nozzle 210 used to adjust the board-positioning data for positioning the PWB supporting device 40 to thereby position the printed-wiring board 38, and adjusting the board-positioning data on the basis of the obtained amount and direction of the positioning error of the suction nozzle 210. The positioning portion is arranged to obtain the amount and direction of the positioning error of each suction nozzle 210, on the basis of the suction-nozzle code identifying the suction nozzle 210 and the rotating speed of the cam 112 which are used to mount the electric component 28 on the board 38, and according to sets of estimated positioning error data ΔXC, ΔYC which are obtained and stored in the RAM 306 in relation to the suction-nozzle code identifying the respective suction nozzles 210 and the rotating speed of the cam 112 used to obtain the positioning error data. It will also be understood that the speed-control-pattern changing means of the control-target determining portion is a portion of the control device 300 assigned to change or select the rotating speed of the cam 112 between or from two values depending upon the kind of the electric component 28, and that the test-chip mounting control means of the control-target determining portion is a portion of the control device 300 assigned to move each of component-holding head 140 holding the test chip 330, at each of the two different rotating speed values selected by the speed-control-pattern changing means, and operate the head 140 to mount the test chip 330 on the test substrate 332. It will further be understood that the data processing means of the control-target determining means is a portion of the control device 300 assigned to obtain the estimated positioning error data ΔXC, ΔYC for each suction nozzle 210 and for each of the two different rotating speed values of the cam 112, by processing image data representative of images of the test chips 330 as mounted on the test substrate 332, which images are taken by the fiducial-mark camera 70. It will also be understood that the control-target determining means of the control-target determining portion is a portion of the control device 300 assigned to store the sets of estimated positioning error data ΔXC, ΔYC obtained by the data processing means, in relation to the suction-nozzle code and each of two rotating speed values of the cam 112. It will further be understood that a portion of the RAM 306 serves as memory means for storing the sets of estimated positioning error data ΔXC, ΔYC in relation to the suction-nozzle code and each of the two rotating speed values of the cam 112. The control-target determining portion may be considered to be constituted by a portion of the control device 300 assigned to read out one of the sets of estimated positioning error data ΔXC, ΔYC from the memory means, on the basis of the suction-nozzle code and the rotating speed of the cam 112 used to mount the electric component 28 on the board 38.

The sets of estimated positioning error data ΔXC, ΔYC used to adjust the board-positioning data for positioning the PWB supporting device 40 (printed-wiring board 38) may be stored in the RAM 306, in relation to a mounting-position code identifying each of the component-mounting positions or spots on the board 38, rather than the suction-nozzle code identifying the suction nozzle 210 on each component-holding head 140. In the embodiment, the sets of estimated positioning error data ΔXC, ΔYC for all of the component-mounting positions of the electric component 28 are stored in the RAM 306 in relation to the suction-nozzle code and each of the two speed values of the cam 112, as shown in FIG. 13, and data representative of the predetermined relationship between the pattern of control of the moving speed of the head 140 (as represented by the speeds of the cam 112 during the movement and stopping of the head 140) and the set of estimated positioning error data ΔXC, ΔYC is also stored in the RAM 306, so that the appropriate set of estimated positioning error data ΔXC, ΔYC is determined or selected for each of the component-mounting positions on the board 38, on the basis of the stored sets of estimated positioning error data ΔXC, ΔYC and the predetermined relationship.

In the first embodiment described above, the component-holding heads 140 are disposed on the indexing body 126 which is rotated about its axis, and are turned with the indexing body 126 about the axis of rotation of the indexing body 126. However, the principle of the present invention is applicable to an electric-component mounting system wherein a single component-holding head is moved by an XY robot in the XY plane parallel to the working surface of a printed-wiring board. An example of this type of electric-component mounting system will be described as a second embodiment of this invention, by reference to FIGS. 15–18.

Figure 15:
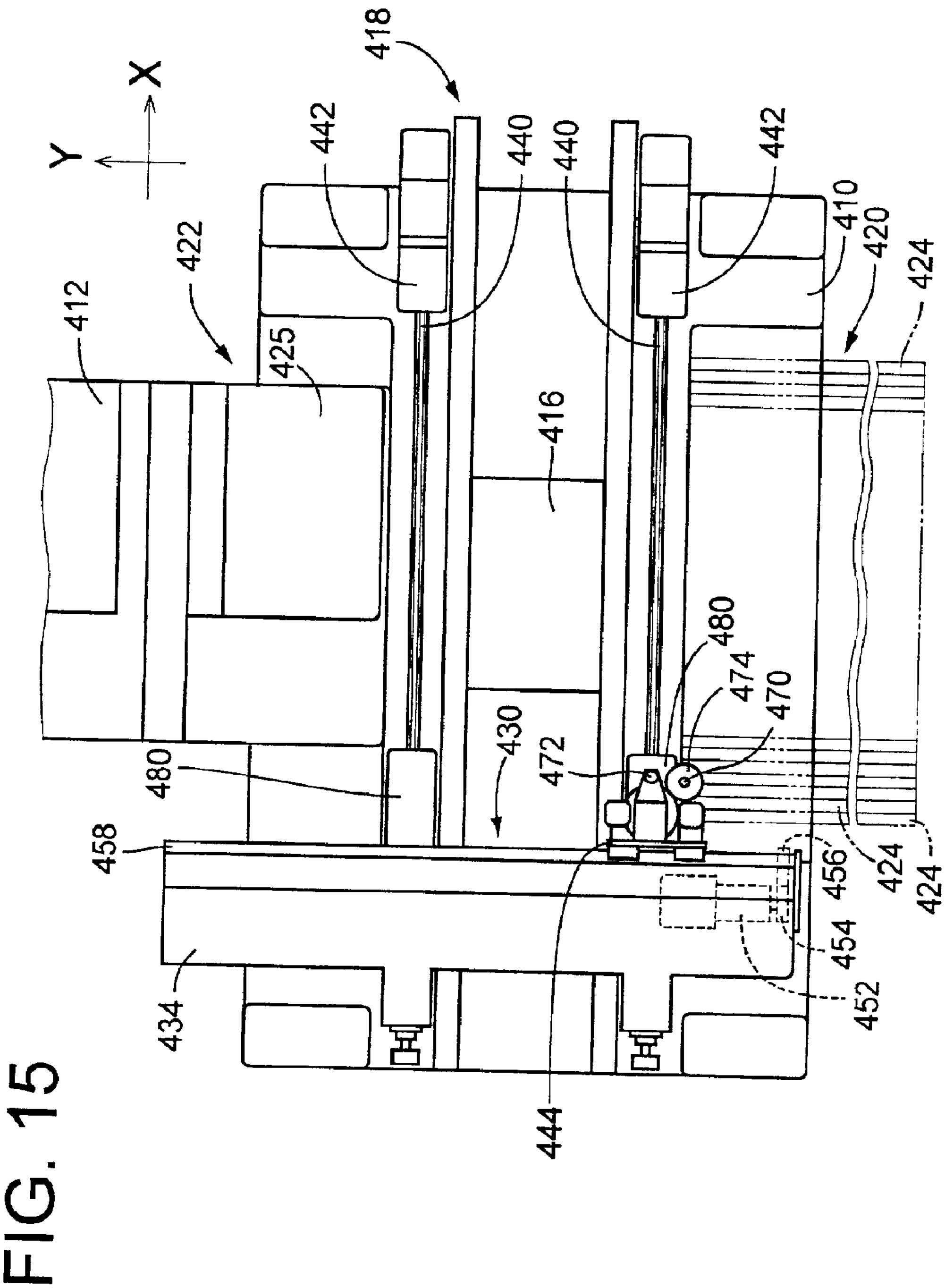
FIG. 15 is plan view of an electric-component mounting system constructed according to a second embodiment of this invention.
Figure 16:
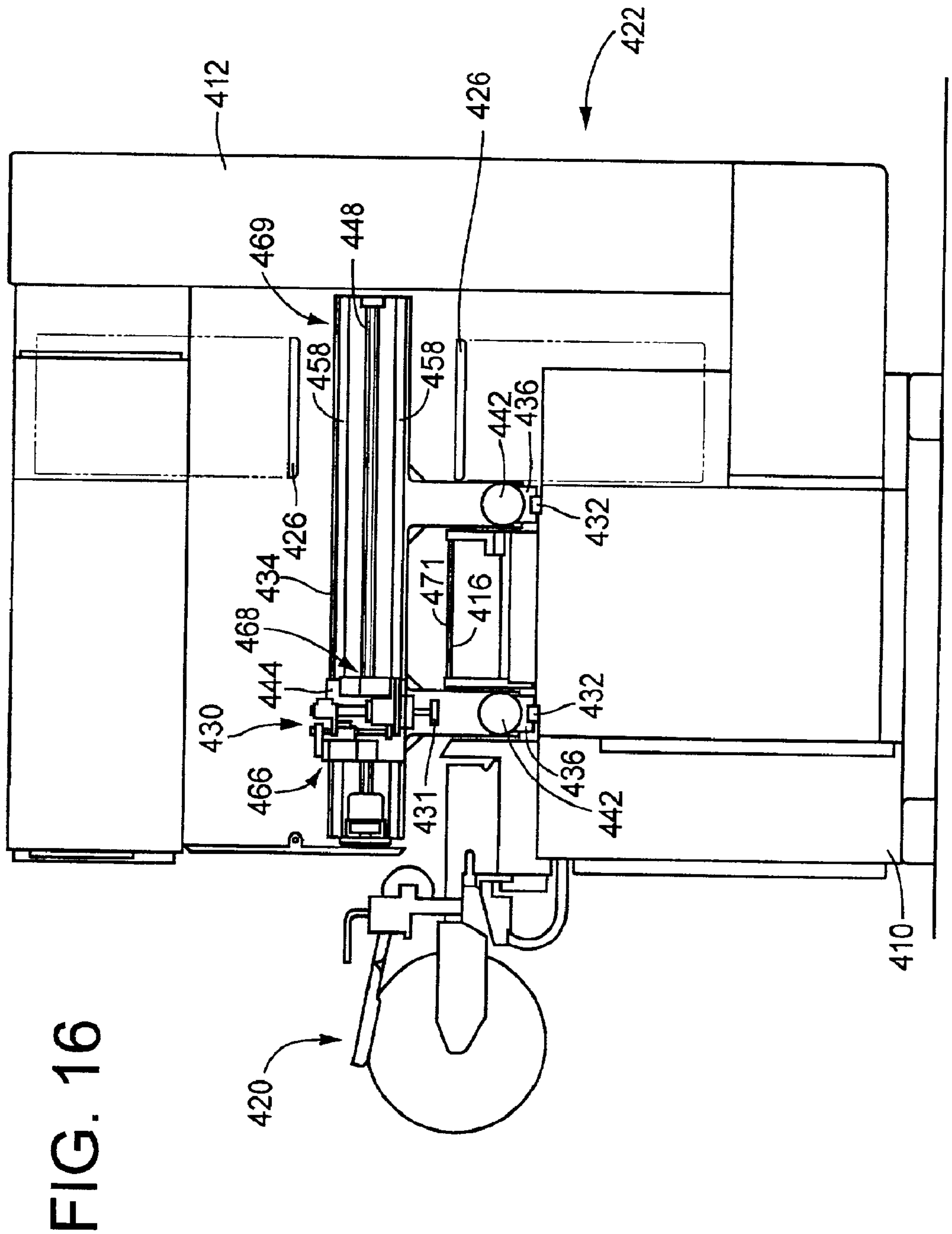
FIG. 16 is a side elevational view of the electric-component mounting system of FIG. 15.
Figure 17:
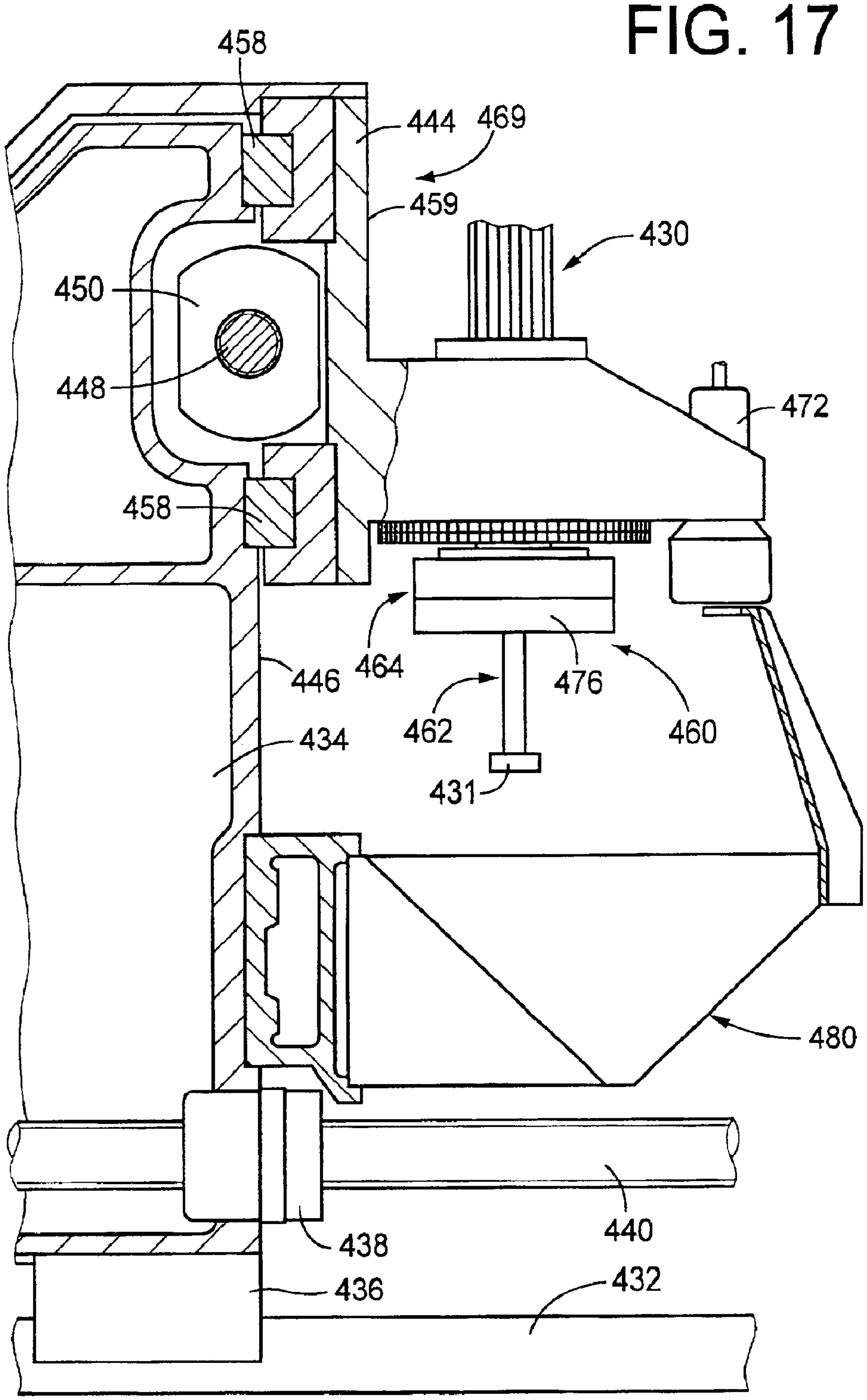
FIG. 17 is a front elevational view (partly in cross section) showing a component-holding head of the electric-component mounting system of FIG. 15.

The electric-component mounting system according to the second embodiment, which is constructed as disclosed in Japanese Patent No. 2824378, will be described in detail regarding a portion of the system which relates to the present invention. In FIG. 15 reference numeral 410 denotes a machine base on which are mounted a plurality of columns 412 extending upright. On the machine base 410, there is also disposed a printed-wiring-board conveyor (PWB conveyor) 418 arranged to feed a printed-wiring board 416 in the X-axis direction (right and left direction as seen in FIGS. 15 and 17). The printed-wiring board 416 is transferred by the PWB conveyor 418, and is stopped by a suitable stopper device (not shown) at a predetermined component-mounting position. The printed-wiring board 416 located at the component-mounting position is supported by a printed-wiring-board supporting device (not shown) such that the board 416 maintains a horizontal attitude.

On the machine base 410, there are fixedly mounted a component supply device 420 of tape feeder type and a component supply device 422 of tray type such that these two component supply devices 420, 422 are disposed on respective opposite sides of the PWB conveyor 418 and are spaced apart from each other in the Y-axis direction perpendicular to the X-axis direction. Like the component supply device 14 used in the first embodiment, the component supply device 420 of tape feeder type includes a multiplicity of tape feeders 424 which are supported by a feeder support table.

The component supply device 422 of tray type includes a multiplicity of component trays 425 each accommodating a multiplicity of electric components 431 (FIG. 17) in respective recesses. The component trays 425 are accommodated in respective multiple tray boxes 426 (shown in FIG. 16) which are vertically arranged and are supported by respective support members (not shown). The tray boxes 426 are elevated one after another by an elevator device disposed within the column 412 to a predetermined component-supply position. For a component-holding head 460 (which will be described) to receive the electric components 431 from the component tray 425 in the tray box 426 located at the component-supply position, some vertical space must be provided above the component-supply position.

To provide the vertical space, the tray box 426 from which the electric components have been transferred to the component-holding head 460 is moved further upwards from the component-supply position to a predetermined retracted position when the next tray box 426 is moved to the component-supply position, so that the required vertical space is provided between the component-supply position and the retracted position. The component supply device 422 of tray type is identical in construction with a component supply device disclosed in JP-B2-2-57719.

The electric-component mounting system includes a component-mounting device 430 including the component-holding head 460, which serves as a component-holding device arranged to receive one electric component 431 at one time from the component tray 425 of the uppermost tray box 426 or a selected one of the tape feeders 424. The component-mounting device 430 is mounted on the machine base 410, and includes an X-axis slide 434 provided with guide blocks 436 for sliding engagement with two guide rails 432 which are disposed on the opposite sides of the PWB conveyor 418, so as to extend in the X-axis direction. One of the guide blocks 436 and one of the two guide rails 432 are shown in FIG. 17.

As shown in FIG. 15, the X-axis slide 434 extends in the Y-axis direction across the PWB conveyor 418, and has a length corresponding to the distance between the component supply device 420 of tape feeder type and the component supply device 422 of tray type. The X-axis slide 434 has two ballnuts 438 (one of which is shown in FIG. 17) which engage respective two ballscrews 440 disposed on the respective opposite sides of the PWB conveyor 418. The two ballscrews 440 are rotated by respective two X-axis drive motor 442 (FIG. 15) in synchronization with each other, so that the X-axis slide 434 is moved in the X-axis direction.

On the X-axis slide 434, there is mounted a Y-axis slide 444, as shown in FIGS. 15 and 17, such that the Y-axis slide 444 is movable on the X-axis slide 434, in the Y-axis direction perpendicular to the X-axis direction in the horizontal plane. The X-axis slide 434 has a vertically extending side surface 446 on which is disposed a ballscrew 448 extending in the Y-axis direction, as shown in FIG. 17. The Y-axis slide 444 has a ballnut 450 which is held in engagement with the ballscrew 448. The ballscrew 448 is operatively connected to a Y-axis drive motor 452 (FIG. 15) through gears 454, 456. The Y-axis slide 444 is moved in the Y-axis direction while being guided by a pair of guide rails 458, when the ballscrew 448 is rotated by the Y-axis drive motor 452.

The Y-axis slide 444 has a vertically extending surface 459 to which is attached the above-indicated component-holding head 460, as shown in FIG. 17. The component-holding head 460 includes a component-holder portion in the form of a suction nozzle 462 for holding the electric component 431 by suction, and a nozzle holder 464 for holding the suction nozzle 464. The component-holding head 460 is mounted on the Y-axis slide 444 such that the component-holding head 460 is vertically movable and is rotatable about its axis. The component-holding head 460 is vertically moved by a vertical drive device 466 (FIG. 16) provided on the Y-axis slide 444, and is rotated by a rotary drive device 468 (FIG. 16) also provided on the Y-axis slide 444, so that the suction nozzle 462 is vertically movable and rotatable together with the component-holding head 460. In the present embodiment, the ballnuts 438, ballscrews 440 and X-axis drive motor 442 cooperate to constitute an X-axis drive device for moving the X-axis slide 434, while the ballnut 450, ballscrew 448 and Y-axis drive motor 452 cooperate to constitute a Y-axis drive device for moving the Y-axis slide 444. These X-axis and Y-axis drive devices cooperate to constitute an XY robot 469. The component-holding head 460 is movable by the XY robot 469 in an XY coordinate system in a horizontal plane parallel to an upper or component-mounting surface 471 (shown in FIG. 16) of the printed-wiring board 416. The XY coordinate system is defined by the mutually perpendicular X-axis and Y-axis directions indicated in FIG. 15.

The Y-axis slide 444 also carries a fiducial-mark camera 470 (FIG. 15) and a component camera 472 (FIG. 17) fixed thereto. The fiducial-mark camera 470 is provided to take images of fiducial marks provided on the printed-wiring board 416, while the component camera 472 is provided to take an image of the electric component 431 as held by the suction nozzle 462 of the component-holding head 460. The fiducial-mark camera 470 and component camera 472 are both CCD cameras, which are arranged to take a two-dimensional image of the object at one time, in the present embodiment. An illuminating device 474 (FIG. 15) is disposed to illuminated the fiducial marks and their vicinity. The nozzle holder 464 is provided with a back light 476, as shown in FIG. 17, so that the component camera 472 is operable to take a silhouette image of the electric component 431, with the back light 476 as a light background.

To the X-axis slide 434, there are fixed two light reflecting devices in the form of two prisms 480, as shown in FIGS. 15 and 17. These prism 480 cooperate with the component camera 472 to constitute an imaging system. The two prism 480 are disposed on a lower portion of the X-axis slide 434, at respective Y-axis positions corresponding to the positions of the two ballscrews 440 for the X-axis slide 434. Described mores specifically, one of the two prism 480 is disposed between the component supply device 420 of tape feeder type and the PWB conveyor 418 (printed-wiring board 416,), while the order prism 480 is disposed between the PWB conveyor 418 and the component supply device 422 of tray type.

Figure 18:
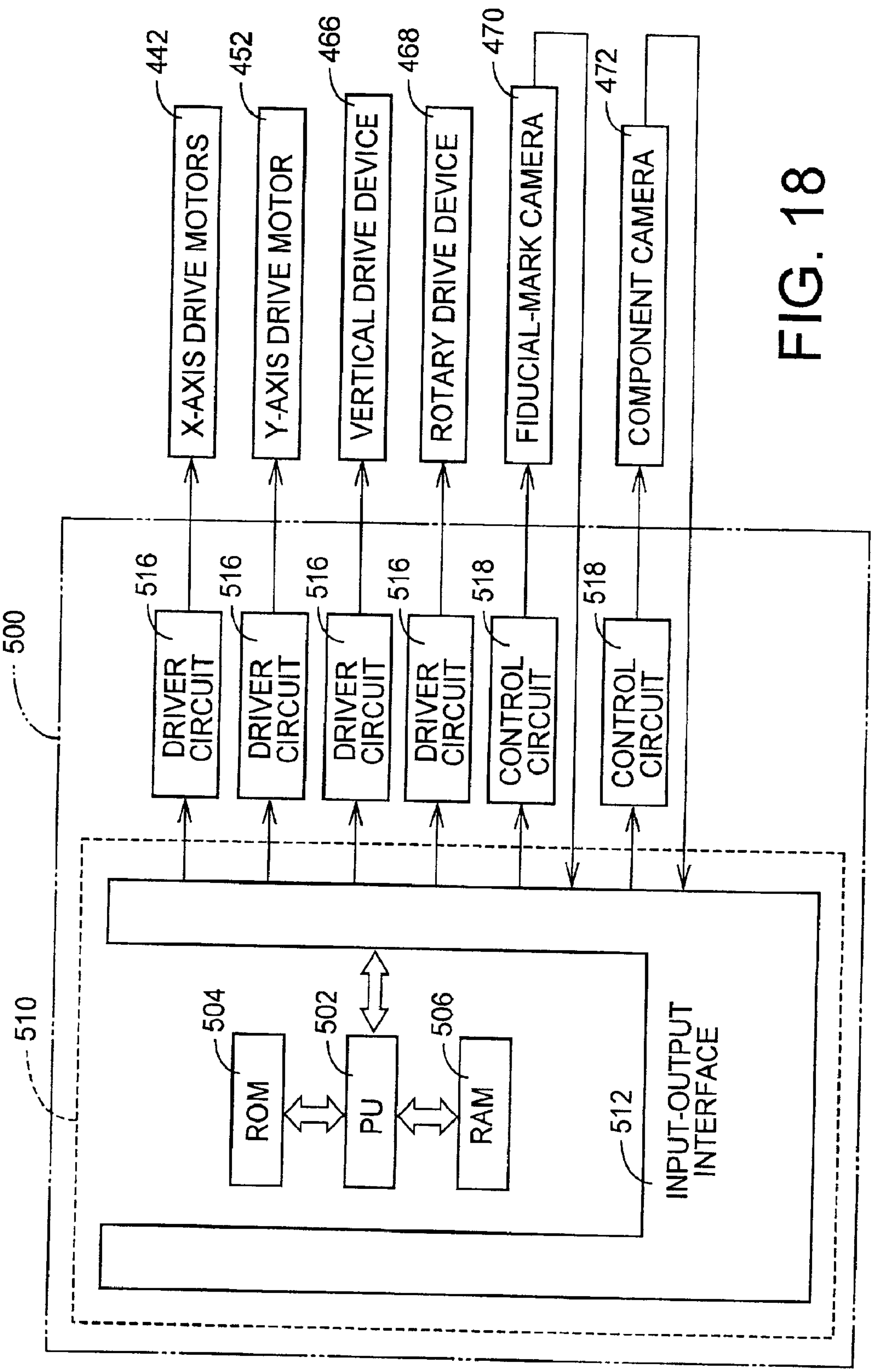
FIG. 18 is a block diagram illustrating a portion of a control device, which closely relates to the present invention.

The electric-component mounting system according to the present second embodiment includes a control device 500 as control means, as shown in FIG. 18. The control device 500 is principally constituted by a computer 510 incorporating a processing unit (PU) 502, a read-only memory (ROM) 504, a random-access memory (RAM) 506 and a bus interconnecting those elements. The bus is connected to an input-output interface 512 to which are connected various actuators such as the X-axis and Y-axis drive motors 442, 452, vertical drive device 466 and rotary drive device 468, through respective driver circuit 516. The drive motors 442, 452 and the drive motors of the drive devices 466, 468 are servomotors, the operating angles or amounts of which are detected by respective rotary encoders (not shown). To the input-output interface 512, there are also connected the fiducial-mark camera 470 and component camera 472 through respective control circuits 518. The RAM 506 stores various control programs such as component-mounting programs for mounting the electric components 431 on the printed-wiring board 416, and positioning-error obtaining programs for obtaining positioning errors of each component-mounting position, on the basis of the pattern of control of moving speed of the component-holding head 460 and the component-mounting position or spot on the board 416.

The operation of the present electric-component system, which is disclosed in Japanese Patent No. 2824378, will be described in detail regarding its aspects which relate to the present invention.

To mount the electric component 431 on the printed-wiring board 416, the component-holding head 460 is moved by movements of the X-axis slide 434 and Y-axis slide 444, to the component-supply portion or position of the component supply device 420 of tape feeder type or component supply device 422 of tray type. At the component-supply position, the component-holding head 460 receives the electric component 431 from the component supply device 420, 422. In the component supply device 420 of tape feeder type, the individual tape feeders 424 have respective component-supply portions or positions which are arranged along a straight line parallel to the X-axis direction. In the component supply device 422 of tray type, the positions of the multiple recesses provided in the selected component tray 425 are the component-supply portions or positions. To hold the electric component 431, the suction nozzle 462 is lowered for contact with the electric component 431, and is communicated with a negative-pressure source, for holding the electric component 431 by suction under a negative pressure. After the electric component 431 is held by the suction nozzle 462, the component-holding head 460 is lifted.

An operation of the component-holding head 460 to receive the electric component 431 from a selected one of the tape feeders 424 of the component supply device 420 of tape feeder type, and mount the electric component 431 on the printed-wiring board 416, will be described by way of example.

The component-holding head 460 holding the electric component 431 is moved to the appropriate component-mounting position on the board 416, along a straight line connecting the component-supply portion of the selected tape feeder 424 and the component-mounting position in question. During this movement of the component-holding head 460, the head 460 passes over the prism 480 fixedly disposed on a portion of the X-axis slide 434 between the component-supply portion of the selected tape feeder 424 and the component-mounting position on the board 416. Irrespective of the position of the component-supply portion of the selected tape feeder 424 and the position at which the electric component 431 is to be mounted on the board 416, the component-holding head 460 necessarily passes over the prism 480 disposed between the component-supply portion of the selected tape feeder 424 and the component-mounting position on the board 416, during the movement of the head 460 in the Y-axis direction by the Y-axis slide 444 on the X-axis slide 434. Accordingly, a light which forms a silhouette image of the electric component 431 existing in the light background provided by the back light 476 is reflected by the prism 480 and is incident upon the component camera 472. Thus, the silhouette image of the electric component 431 is taken by the component camera 472.

Since the component camera 472 and the component-holding head 460 carrying the suction nozzle 462 are both attached to the Y-axis slide 444, the component camera 472 and the electric component 431 held by the suction nozzle 462 are moved as a unit, so that the image of the electric component 431 can be taken by the component camera 472 during the movement of the Y-axis slide 444, as if the electric component 431 were held stationary, as disclosed in Japanese Patent No. 2824378.

Image data representative of the image of the electric component 431 as held by the suction nozzle 462 are compared by the control device 500, with image data representative of a nominal image of the electric component 431 held by the suction nozzle 462 without a positioning error with respect to the suction nozzle 462. Thus, the control device 500 obtains horizontal positioning errors ΔXE and ΔYE and an angular positioning error Δθ of the electric component 431 as held by the suction nozzle 462. Further, images of the fiducial marks provided on the printed-wiring board 416 are taken by the fiducial-mark camera 470, to obtain horizontal positioning errors ΔXP and ΔYP of the board 416 as stopped at the component-mounting position. During the movement of the component-holding head 460 to the appropriate component-mounting position on the board 416, head-positioning data for moving the component-holding head 460 to mount the electric component 431 are adjusted for compensation for the thus obtained horizontal positioning errors ΔXE and ΔYE of the electric component 431 and the horizontal positioning errors ΔXP and ΔYP of the board 416, and the component-holding head 460 is rotated by the rotary drive device 468, for compensation for the angular positioning error Δθ of the electric component 431. Further, the head-positioning data are also adjusted for compensation for changes of the X-axis and Y-axis positions of the electric component 431 as a result of the rotation of the electric component 431 for compensating of the angular positioning error Δθ. Those compensations permit the electric component 431 to be mounted at the predetermined component-mounting position on the printed-wiring board 416, with the predetermined attitude. The component-holding head 460 is eventually moved to a position defined by the head-positioning data, and the head 460 is lowered to lower the suction nozzle 462 for mounting the electric component 431 on the printed-wiring board 431, with the suction nozzle 462 being communicated with a positive-pressure source, to release the electric component 431. Then, the suction nozzle 462 is communicated with the atmosphere. Thus, one cycle of operation to mount one electric component 431 on the board 416 is completed.

As described above, the component-holding head 460 which has received the electric component 431 from the component supply device 420 or 422 is continuously moved to a component-mounting position defined by the head-positioning data, without stopping on its way to the position at which the electric component 431 is mounted on the board 416. The speed at which the component-holding head 460 is moved to the component-mounting position is controlled in one of a plurality of patterns. In this embodiment, the stopping time during which the head 460 remains at the component-mounting position is held constant, and the moving speed of the head 460 is controlled on the basis of the required moving time of the head 460, such that the pattern of control of the moving speed of the head 460 is changed by changing the acceleration and deceleration values of the head 460 in two or more steps. In other words, the moving speed between the moment of termination of the acceleration and the moment of initiation of the deceleration of the head 460 is held constant for all kinds of the electric component 431.

For example, the pattern of control of the moving speed of the head 460 is changed depending upon at least one of the height dimension and mass of the electric component 431 in question. In this respect, it is noted that the electric components 431 supplied from the component supply device 420 of tape feeder type have a comparatively small size, while the electric components 431 supplied from the component supply device 422 of tray type have a comparatively large size. Therefore, the component-holding head 460 holding the electric component 431 supplied from the component supply device 420 of tape feeder type is moved at comparatively high acceleration and deceleration values, while the component-holding head 460 holding the electric component 431 supplied from the component supply device 422 of tray type is moved at comparatively low acceleration and deceleration values. The movement of the component-holding head 460 is effected by movements of the X-axis slide 434 and the Y-axis slide 444 of the XY robot 469. Therefore, the pattern of control of the moving speed of each head 460 can be changed by changing the pattern of control of the speeds of movements of the XY robot 469.

The suction nozzle 462 may have a positioning error due to elastic deformation of the component-holding head 460 and the XY robot 469 upon stopping of the head 460 at each component-mounting position which corresponds to each predetermined component-mounting position on the printed-wiring board 416 and which is located above the component-mounting position. To compensate the head-positioning data for a positioning error of the electric component 431 due to this positioning error of the suction nozzle 462, the amount and direction of the positioning error of the electric component 431 are obtained by experimentation. In the present second embodiment, the component-holding head 460 is moved in the X-axis and Y-axis directions between the component-receiving position and the component-mounting position, which change depending upon the electric component 431 to be mounted on the board 416. Therefore, the distance and direction of movement of the head 460 change depending upon the electric component 431, that is, depending upon the component-mounting position at which the electric component 431 is mounted on the board 416. Further, the acceleration and deceleration values are changed depending upon the kind (size) of the electric component 431, as described above. Accordingly, the positioning error of the electric component 431 must be obtained for each of the component-mounting positions of the head 460 corresponding to the respective component-mounting positions on the board 416.

In view of the above, test operations are performed to mount the electric components 431 on the printed-wiring board 46, and take images of the electric components 431 as mounted on the board 416, for thereby obtaining the positioning errors of the electric components 431. For simplification of description, it is assumed that the vibration of the electric component 431 caused by acceleration of the component-holding head 460 has been attenuated during a constant-speed movement of the head 460, and that the positioning error of the electric component 431 is caused solely by the vibration caused by deceleration and stopping of the head 460 at the component-mounting position.

The test operations are performed on a predetermined number of printed-wiring boards 416 of the same kind, for instance, three boards 416. All of the electric components 431 are mounted on the first printed-wiring board 416, and the fiducial-mark camera 470 are moved by the XY robot 469 to each of the predetermined component-mounting positions, to take images of these electric components 431 as mounted on the board 416. In the test operations, the component-holding head 460 is moved to each of the component-mounting positions which are defined by respective sets of head-positioning data prepared to mount the electric components 431 at the respective component-mounting positions on the board 416. The component-mounting position of the head 460 corresponding to each component-mounting position on the board 416 is the position of the axis of rotation of the nozzle holder 464 in the XY plane. The fiducial-mark camera 470 is moved to take the image of each electric component 431 mounted on the board 416, according to the head-positioning data, and the known positional relationship between the fiducial-mark camera 470 and the axis of the nozzle holder 464.

Similarly, the test operations are performed on the second and third printed-wiring boards 416 to take the images of the electric components 431 as mounted on these boards 416. Image data representative of the images of the electric components 431 are processed to calculate the amount and direction of relative positioning error between the actual position at which the electric component 431 was mounted on the board 416, and the predetermined or nominal component-mounting position on the board 416. Thus, three sets of X-axis and Y-axis positioning errors of each electric component 431 (each component-mounting position) corresponding to the three printed-wiring boards 416 are obtained. An average of the three positioning error values obtained in each of the X-axis and Y-axis directions is used as an estimated set of positioning errors of each component-mounting position, which is used to adjust the head-positioning data for moving the component-holding head 460 to the corresponding component-mounting position. A control target used by the control device 500 is obtained as differences between coordinate values of the component-mounting position represented by the adjusted head-positioning data and coordinate values of the nominal component-mounting position.

The RAM 506 stores various kinds of data including: head-positioning data representative of the nominal component-mounting positions to which the component-holding head 460 is moved to mount each electric component 431; data representative of the kind of each electric component 431; data representative of the pattern of control of the moving speed of the head 460 corresponding to each electric component 431; and positioning error data representative of the X-axis and Y-axis positioning errors of each electric component 431 (each component-mounting position on the board 416). When each electric component 431 is mounted on the board 416, the appropriate data are read out from the RAM 506. The control target used by the control device 500 to control the movement of the component-holding head 460 is stored for each component-mounting position, and for each of the different patterns of control of the moving speed of the head 460. Thus, a plurality of control targets are selectively used depending upon the specific pattern of control of the moving speed of the head 460 in the actual component mounting operation. Upon mounting of each electric component 431 on the printed-wiring board 416, the head-positioning data are adjusted on the basis of the appropriate set of estimated X-axis and Y-axis positioning errors (detected amount and direction), to compensate the actual component-mounting position of the head 460 for the estimated positioning errors in the X-axis and Y-axis directions, so that the electric component 431 can be mounted at the nominal component-mounting position. In this embodiment, a portion of the control device 500 assigned to read out the appropriate set of positioning errors from the RAM 506, depending upon the component-mounting position, and adjust the head-positioning data for compensation for the positioning errors functions as the positioning portion operable to position the component-holding head 460 depending upon the specific pattern of control of the moving speed.

In the second embodiment, the component-holding head 460 is stopped for a predetermined time at all of the component-mounting positions. However, the stopping time of the head 460 may be changed depending upon the component-mounting position. In this case, the control target is determined on the basis of the stopping time of the head 460 as well as the pattern of control of the moving speed of the head 460.

The second embodiment may be modified to obtain the estimated positioning errors at each component-mounting position, by using test chips and substrates as in the first embodiment. In this case, comparatively small test chips are supplied from a test-chip tape feeder which is provided as part of the component supply device 420 of tape feeder type and supported on the feeder support table like the tape feeders 424. Each test substrate is supported by the PWB supporting device, like the printed-wiring board 416.

The test-chip tape feeder is fixedly disposed in the component supply device 420, so that the test chips are supplied at the same supply position. In this respect, the test operations using the test chips and substrate are different from the actual operations to mount the electric components 431 on the board 416, wherein the electric components 431 are supplied from the different component-supply positions of the tape feeders 424. In view of this difference, the test chips are mounted on the test substrate such that a plurality of test chips are placed along each of a plurality of circles which have centers at the supply position of the test-chip tape feeder and have different diameters. The test chips are mounted on the test substrate, such that the test chips are arranged in radial directions of the above-indicated circles.

In addition, the test chips are mounted with the moving speed of the component-holding head 460 being controlled in different patterns (different acceleration and deceleration values), such that the test chips are mounted on a plurality of test substrates, with the moving speed of the head 460 being kept in the same pattern (at the same acceleration and deceleration values). The moving speed of the head 460 is controlled in the same pattern for all of the test-chip mounting positions on the same test substrate. Thus, the test chips are mounted on a plurality of test substrates, for each of the different patterns of control of the moving speed of the component-holding head 460.

The images of the test chips mounted on each of the test substrates are taken by the fiducial-mark camera 470. After the images of the test chips mounted on all of the test substrates have been taken, image data representative of the images are processed to obtain two or more sets of obtain X-axis and Y-axis positioning errors of each test-chip mounting position, for each of the different patterns of control of the moving speed of the component-holding head 460. An average of the obtained two or more X-axis positioning errors and an average of the obtained two or more Y-axis positioning errors are obtained as a set of basic X-axis and Y-axis positioning errors for each of the test-chip mounting positions. The thus obtained sets of basic positioning errors are stored in the RAM 506, in relation to the test-chip mounting positions and the different patterns of control of the moving speed of the head 460.

When the electric components 431 are mounted on the printed-wiring board 416, the head-positioning data are adjusted on the basis of the thus obtained sets of basic positioning errors. For each electric component 431 which is mounted with the head 460 being moved in one of the different patterns of control of its moving speed, two or more of the stored sets of basic positioning errors are selected depending upon the component-mounting position of the electric component 431 in question and the pattern of control of the moving speed of the head 460 used for this electric component 431. Described more specifically, the two or more sets of basic positioning errors of the test-chip mounting positions which are close to the component-mounting position of the electric component 431 are selected, and a set of estimated positioning errors used for adjusting the head-positioning data is obtained as a control target, by interpolation of the selected sets of basic positioning errors. Thus, the basic positioning errors obtained by the test operations using the test chips and substrates are used as basic data to prepare the estimated positioning errors used as the control target. The basic data may be used even when the kind of the printed-wiring board 416 is changed, that is, even when the component-mounting positions are changed. Accordingly, the use of the obtained basic data eliminates a need of performing the test operations each time the kind of the board 416 is changed, and permits prevention or reduction of the positioning error of each electric component 431 as mounted on the board of any kind.

For easier understanding of the present invention, the foregoing description of the operation of the electric-component mounting system according to the second embodiment is based on an assumption that the component-holding head 460 holding the electric component 431 supplied from the component supply device 420 or 422 is continuously moved to the appropriate component-mounting position, without stopping on its way to this position, and the vibration of the head 460 generated upon starting of the movement of the head 460 has been attenuated when the head 460 reaches the component-mounting position. However, the head 460 may be stopped on its way to the component-mounting position, for the purpose of taking the image of the electric component 431. In this case, the component camera 472 may be fixedly disposed on a portion of the component mounting device 430, other than the Y-axis slide 444, for instance, on the X-axis slide 434, or alternatively, on the machine base 410. Where the component camera 472 is disposed on the X-axis slide 434, the image of the electric component 431 may be taken during the movement of the component-holding head 460 in the X-axis direction, while the movement in the Y-axis direction is stopped. Alternatively, the image is taken while the movements in the X-axis and Y-axis directions are both stopped.

In the above case, the component-holding head 460 is stopped at two positions, that is, at the image-taking position and the component-mounting position. Where the distance between these two positions is relatively short, there is a possibility that the vibration of the head 460 generated upon starting of the movement from the image-taking position to the component-mounting position has not been sufficiently attenuated when the head 460 reaches the component-mounting position. In this case, the set of estimated positioning errors used to adjust the head-positioning data may be determined by taking the degree of this vibration into account. Where the direction of movement of the head 460 from the component-supply position to the image-taking position is different from the direction of movement of the head 460 from the image-taking position to the component-mounting position, or where the direction of movement of the head 460 while the image of the electric component 431 is taken is different from the direction of movement from the image-taking position to the component-mounting position, this difference in the moving direction of the head 460 may be taken into account in determining the set of estimated positioning errors as the control target.

While the rotating speed of the cam 112 is changed in three steps, that is, selectively controlled to be one of the 100% speed, 80% speed and 60% speed of the maximum speed, in the first embodiment of FIGS. 1–14, the rotating speed may be changed in four or more steps, or continuously changed.

In the first embodiment of FIGS. 1–14, the control target is changed depending upon whether the cam 112 is rotated at the 100% speed or 80% speed. Further, the set of estimated positioning errors obtained when the cam 112 is rotated at its maximum or 100% speed is used to adjust the board-positioning data for positioning the printed-wiring board 38, only in the case where the cam 112 is rotated at its maximum 100% speed during both of movement and stopping of the head 140. In the other cases, the set of estimated positioning errors obtained when the cam 112 is rotated at the 80% speed is used to adjust the board-positioning data, irrespective of whether the rotating speed of the cam 112 during the component mounting operation is the 80% speed or lower than the 80% speed. However, the sets of estimated positioning errors of each component-mounting position may be obtained for any percent values of the maximum speed of the cam 112, other than the 100% and 80% values, for instance, for each of the 90%, 60%, 40% and 20% values of the maximum speed. In this case, too, an appropriate one of the thus obtained estimated positioning errors is selected depending upon the specific pattern of control of the moving speed of the head 140, for adjusting the board-positioning data. Further, sets of estimating positioning errors may be obtained for each of different rotating speeds of the cam 112 during movement and stopping of the head 140, combinations of which define different patterns of control of the moving speed of the head 140. To adjust the board-positioning data according to the principle of this invention, an appropriate one of the thus obtained sets is selected, depending upon the specific pattern of control of the moving speed of the head 140 during the component mounting operation.

Sets of estimated positioning errors of each component-mounting position may be obtained for each of a plurality of patterns of control of the moving speed of the component-holding head which are selectively used in the actual component mounting operation. In this case, test operations are performed by moving and stopping the component-holding head in each of the patterns of control of the moving speed used in the actual mounting operation. Where the rotating speed of the cam 112 during the movement of the head is different from that during the stopping of the head in the actual component mounting operation, the cam 112 is rotated at the different rotating speeds during the movement and stopping of the head, respectively, in the test operation. Where the cam 112 is rotated at the same speed during both of the movement and stopping of the head in the actual component mounting operation, the cam 112 is rotated at the same speed during the movement and stopping of the head in the test operation.

Where a plurality of component-holding heads are successively moved to a predetermined component-mounting position with an intermittent rotary motion of an indexing body, as in the first embodiment, the pattern of control of the moving speed of each component-holding head may be determined by only the moving time of the head, without taking account of the stopping time, that is, by only the rotating speed of the cam 112 during the movement of the head. In this case, sets of estimated positioning errors of each component-mounting position are obtained for each of the different patterns of control of the moving speed of the head, and an appropriate one of the thus obtained sets is selected to obtain the control target to be used, depending upon the pattern of control of the moving speed used in the actual component mounting operation.

Where the plurality of component-holding heads are successively moved to the predetermined component-mounting position with an intermittent rotary motion of the indexing body, as in the first embodiment, the test operation may be performed by mounting the electric components on the printed-wiring board, to obtain sets of estimated positioning errors of each component-mounting position on the board, for determining the control targets.

In the illustrated embodiments, the test chips of the same kind are used for the test operations to obtain sets of positioning errors of each component-mounting position. However, test chips of different kinds which are different from each other in at least one of the height dimension and mass may be used for the test operations. On the basis of the thus obtained sets of positioning errors, sets of estimated positioning errors to adjust the board-positioning data or the head-positioning data are determined by calculation, depending upon at least one of the height dimension and mass of each electric component to be mounted on the printed-wiring board.

The test operations using the test chips may be performed in any manner other than the manner used in the first embodiment where the plurality of component-holding heads are successively moved to the predetermined component-mounting position with the intermittent rotary motion of the indexing body. For instance, all of the component-holding heads are moved to the component-mounting position with the cam 112 rotated at the maximum or 100% speed, to mount the test chips on the test substrate. Then, the rotating speed of the cam 112 is reduced to the 80% value, and all of the component-holding heads are moved to the component-mounting position at the 80% speed of the cam 112, to mount the test chips on the test substrate. These test operations are repeated a predetermined number (N) of times. Alternatively, the test operation to mount the test chips on the test substrate by moving all of the heads at the 100% speed of the cam 112 is repeated the predetermined number of times. Then, the test operation by moving all of the heads at the 80% speed of the cam 112 is repeated the predetermined number of times.

Where the component-holding head is moved by the XY robot to mount the electric components on the printed-wiring board, the head may be moved at a constant speed which is selected from a plurality of different speeds, for a predetermined distance, for instance, between the component-supply position or the image-taking position and the component-mounting position. This speed during the constant-speed movement of the head may be selected depending upon the distance of this movement, for instance, such that the speed of the constant-speed movement is increased with an increase of the distance of this movement.

A plurality of component-holding heads may be provided on an XY robot, so that the heads are moved by the XY robot to mount the electric components on the printed-wiring board. In this case, sets of estimated positioning errors of each component-mounting position are obtained for each of the component-holding heads, to determine the control targets, in relation to the pattern of control of the moving speed of each head, and the component-supply position.

Where the electric components are mounted on the printed-wiring board by turning a plurality of component-holding heads, the heads may be turned and stopped by turning on and off a drive motor used to turn the heads. In this case, too, the speed of the turning movement of each component-holding head can be controlled in one of different patterns, by changing the operating speed and stopping time of the drive motor, to thereby control the moving and stopping times of the head as desired. Sets of estimated positioning errors of each component-mounting position are obtained for each of the different patterns of control of the moving speed of each head, as in the first embodiment in which the cam 112 is used to turn the component-holding heads 140.

Where a plurality of component-holding heads having suction nozzles are successively moved to the predetermined component-mounting position with the intermittent rotary movement of an indexing body, as in the first embodiment, each suction nozzle may be communicated with a positive-pressure source to efficiently release the electric component upon mounting of the electric component on the printed-wiring board, and subsequently communicated with the atmosphere. The selective communication of the suction nozzle with the negative-pressure source, the positive-pressure source and the atmosphere may be effected either mechanically by a mechanically operated switch valve and a control device for controlling this switch valve, or electrically by an electromagnetically operated switch valve.

In the first embodiment, the engaging member 182 of the rotation transmitting shaft 172 is placed in the non-relative-movement state in which the engaging member 182 is not moved relative to the engaging member of each working device such as the component hold-position rectifying device, in the rotating direction of the indexing body 126, as described above by reference to the time chart of FIG. 8. However, this non-relative-movement state is not essential, and the engaging member 182 may be moved with the component-holding head 140 as a unit to each working position, in the rotating direction of the indexing body 126.

Where each component-holding unit has a plurality of suction nozzles, as in the first embodiment, all of the suction nozzles are different in kind from each other, or those suction nozzles include two or more suction nozzles of the same kind. Alternatively, all of the suction nozzles are of the same kind.

While some presently preferred embodiments of this invention and some modifications thereof have been described in detail, for illustrative purpose only, it is to be understood that the present invention may be embodied with various other changes, modifications and improvements, such as those described in the SUMMARY OF THE INVENTION, which may occur to those skilled in the art, without departing from the spirit and scope of the invention defined in the following claims:

What is claimed is:

1. An electric-component mounting system, comprising:

a component-holding device arranged to hold an electric component;

a board-supporting device arranged to support a printed-wiring board on which the electric component is mounted;

a first relative-movement device operable to move said component-holding device and said board-supporting device relative to each other in a first direction parallel to a surface of the printed-wiring board supported by the board-supporting device;

a second relative-movement device operable to move said component-holding device and said board-supporting device relative to each other in a second direction which intersects said surface of the printed-wiring board supported by the board-supporting device; and a control device including a positioning portion operable to select one of a plurality of different positioning error values which is used to compensate positioning data used for said first relative-movement device to establish a predetermined relative position between said component-holding device and said board-supporting device, such that said positioning data are compensated for said selected one of said plurality of different positioning error values, said positioning portion selecting said one of said plurality of different positioning error values, depending upon a selected one of different patterns of control of an operating speed of said first relative-movement device.

2. An electric-component mounting system according to claim 1, wherein said first relative-movement device includes an XY robot operable to move said component-holding device in an XY plane defined by mutually perpendicular X and Y axes and parallel to said surface of said printed-wiring board supported by said board-supporting device.

3. An electric-component mounting system according to claim 1, wherein said first relative-movement device includes:

a turning device holding a plurality of component-holding members of said component-holding device and operable to turn said component-holding members about a common axis of turning, for successively moving said component-holding members to a predetermined component-mounting position; and a board-positioning device operable to move said board-holding device in said first direction, for bringing a selected position on said printed-wiring board into alignment with said component-mounting position in a plane parallel to said surface of the printed-wiring board supported by said board-supporting device.

4. An electric-component mounting system according to claim 1, wherein said control device further includes a memory which stores said plurality of different positioning error values, in relation to said plurality of different patterns of control of the operating speed of said first relative-movement device, respectively.

5. An electric-component mounting system according to claim 1, wherein said control device further includes a positioning-error obtaining portion operable to obtain said plurality of different positioning error values, by experimentation conducted under said plurality of different patterns of control of the operating speed of said first relative-movement device, respectively.

6. An electric-component mounting system according to claim 1, wherein said positioning portion selects said one of said plurality of different positioning error values depending upon a selected one of a plurality of different patterns of control of a speed of movement of said component-holding device by said first relative-movement device relative to said board-supporting device.

7. An electric-component mounting system according to claim 1, wherein said positioning portion further includes a pattern selecting portion operable to select said one of said plurality of different patterns of control of the operating speed of said first relative-movement device, on the basis of the electric component held by said component-holding device.

8. An electric-component mounting system comprising:

a component supply device operable to supply electric components;

a plurality of component-holding members each arranged to hold the electric component supplied from said component supply device;

a turning device holding said plurality of component-holding members and operable to turn said component-holding members about a common axis of turning, for successively moving said component-holding members to a predetermined component-mounting position;

a board-supporting/positioning device arranged to support a printed-wiring board on which said electric components are to be mounted, and operable to move said printed-wiring board in a plane parallel to a surface of the printed-wiring board, for bringing a selected position on said printed-wiring board into alignment with said component-mounting position in said plane; and a control device including a positioning portion operable to select one of a plurality of different control targets which is used for said board-supporting/positioning device to move said selected position on said printed-wiring board to said component-mounting position, said positioning portion selecting said one of said plurality of different control targets, depending upon a pattern of control of a speed of a turning movement of each of said component-holding members to said component-mounting position by said turning device.

9. An electric-component mounting system according to claim 8, wherein said turning device includes an indexing body intermittently rotatable about said common axis of turning, and said positioning portion of said control device selects said one of said plurality of different control targets according to at least one of a maximal value of a rotating speed of said indexing body and a deceleration value of said indexing body.

10. An electric-component mounting system according to claim 9, wherein at least one of said maximal value of the rotating speed and deceleration value of said indexing body is variable in a predetermined first number (integer $N^3$ 2) of steps, while said positioning portion is operable to change the control target used to move said selected position, in a predetermined second number (integer M) of steps which is not larger than said predetermined first number.

11. An electric-component mounting system according to claim 10, wherein said predetermined second number (M) is smaller than said predetermined first number (N).

12. An electric-component mounting system according to claim 8, wherein said control device includes memory means for storing said plurality of different control targets in relation to respective different patterns of control of a speed at which each of said component-holding members is turned by said turning device about said common axis of turning.

13. An electric-component mounting system according to claim 8, wherein said control device further includes control-target determining portion operable to determine said plurality of different control targets which are selectively used to move said selected position on said printed-wiring board to said component-mounting position.

14. An electric-component mounting system according to claim 13, wherein said control-target determining portion includes:

speed-control-pattern changing means for selecting one of a plurality of different patterns of control of the speed of the turning movement of said component-holding members;

test-chip mounting control means for operating said component-holding members to hold said test chips, moving said component-holding members in each of said plurality of different patterns of control of said turning speed, and operating said component-holding members to mount said test chips at respective test-chip mounting positions on said printed-wiring board;

an image-taking device operable to take images of said test chips as mounted on said printed-wiring board by said test-chip mounting control means;

data processing means for processing image data representative of said images of said test chips, to obtain an amount and a direction of a positioning error of each of said test chips with respect to said test-chip mounting positions; and control-target determining means for determining said plurality of different control targets, on the basis of the amounts and directions of the positioning errors of said test chips obtained by said data processing means.

15. An electric-component mounting system, comprising:

a component-holding device arranged to hold an electric component;

a board-supporting device arranged to support a printed-wiring board on which the electric component is mounted;

a first relative-movement device operable to move said component-holding device and said board-supporting device relative to each other in a first direction parallel to a surface of the printed-wiring board supported by the board-supporting device;

a second relative-movement device operable to move said component-holding device and said board-supporting device relative to each other in a second direction which intersects said surface of the printed-wiring board supported by the board-supporting device; and a control device including a positioning portion operable to select one of a plurality of different control targets which is used for said first relative-movement device to establish a predetermined relative position between said component-holding device and said board-supporting device, said positioning portion selecting said one of said plurality of different control targets, depending upon a pattern of control of an operating speed of said first relative-movement device, and wherein said control device further includes a control-target determining portion which includes:

speed-control-pattern changing means for selecting one of a plurality of different patterns of control of a moving speed of said component-holding device;

test-chip mounting control means for operating said component-holding device to hold said test chips, moving said component-holding device in each of said plurality of different patterns of control of said moving speed, and operating said component-holding device to mount said test chips at respective test-chip mounting positions on said printed-wiring board;

an image-taking device operable to take images of said test chips as mounted on said printed-wiring board by said test-chip mounting control means;

data processing means for processing image data representative of said images of said test chips, to obtain an amount and a direction of a positioning error of each of said test chips with respect to said test-chip mounting positions; and control-target determining means for determining said plurality of different control targets, on the basis of the amounts and directions of the positioning errors of said test chips obtained by said data processing means.

* * * * *